(12) United States Patent
Hiruma et al.

(10) Patent No.: US 7,748,825 B2
(45) Date of Patent: Jul. 6, 2010

(54) DROPLET DISCHARGE METHOD, DROPLET DISCHARGE APPARATUS, MANUFACTURING METHOD FOR LIQUID CRYSTAL DEVICE, LIQUID CRYSTAL DEVICE, AND ELECTRONIC APPARATUS

(75) Inventors: Kei Hiruma, Chino (JP); Tomomi Kawase, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 269 days.

(21) Appl. No.: 11/491,059

(22) Filed: Jul. 24, 2006

(65) Prior Publication Data

US 2006/0260543 A1 Nov. 23, 2006

Related U.S. Application Data

(62) Division of application No. 10/626,565, filed on Jul. 25, 2003, now abandoned.

(30) Foreign Application Priority Data

| Jul. 31, 2002 | (JP) | ............................. 2002-223151 |
| Jul. 17, 2003 | (JP) | ............................. 2003-198651 |

(51) Int. Cl.
    *B41J 2/15* (2006.01)
(52) U.S. Cl. ................................. 347/41; 347/5; 347/13
(58) Field of Classification Search .................... 347/2, 347/3, 4, 19, 41, 5, 12, 13, 100; 700/240; 358/296; 430/7
    See application file for complete search history.

(56) References Cited

U.S. PATENT DOCUMENTS

| 4,739,415 | A | * | 4/1988 | Toyono et al. ............... 358/296 |
| 5,477,349 | A |   | 12/1995 | Fujiwara |
| 5,511,591 | A |   | 4/1996 | Abe |
| 5,707,957 | A |   | 1/1998 | Yianakopoulos et al. |
| 5,731,827 | A | * | 3/1998 | Mantell et al. ................. 347/40 |
| 5,865,220 | A |   | 2/1999 | Nakamura et al. |
| 6,022,647 | A | * | 2/2000 | Hirose et al. .................... 430/7 |
| 6,061,608 | A | * | 5/2000 | Moldavsky ................. 700/240 |
| 2002/0081503 | A1 | * | 6/2002 | Kawase et al. ................. 430/7 |

FOREIGN PATENT DOCUMENTS

| EP | 0994180 A1 | 9/1995 |
| JP | A 10-323601 | 12/1998 |
| JP | A 11-248927 | 9/1999 |

* cited by examiner

*Primary Examiner*—Lam S Nguyen
(74) *Attorney, Agent, or Firm*—Oliff & Berridge PLC

(57) ABSTRACT

A droplet discharge method for discharging a liquid material from a discharge device and arranging the liquid material in a specified quantity on a substrate, the discharge device includes a nozzle for discharging the liquid material in droplets, and the droplet discharge method include the steps of cleaning the nozzle using the liquid material, and arranging at least a part of the liquid material used for cleaning on the substrate.

7 Claims, 24 Drawing Sheets

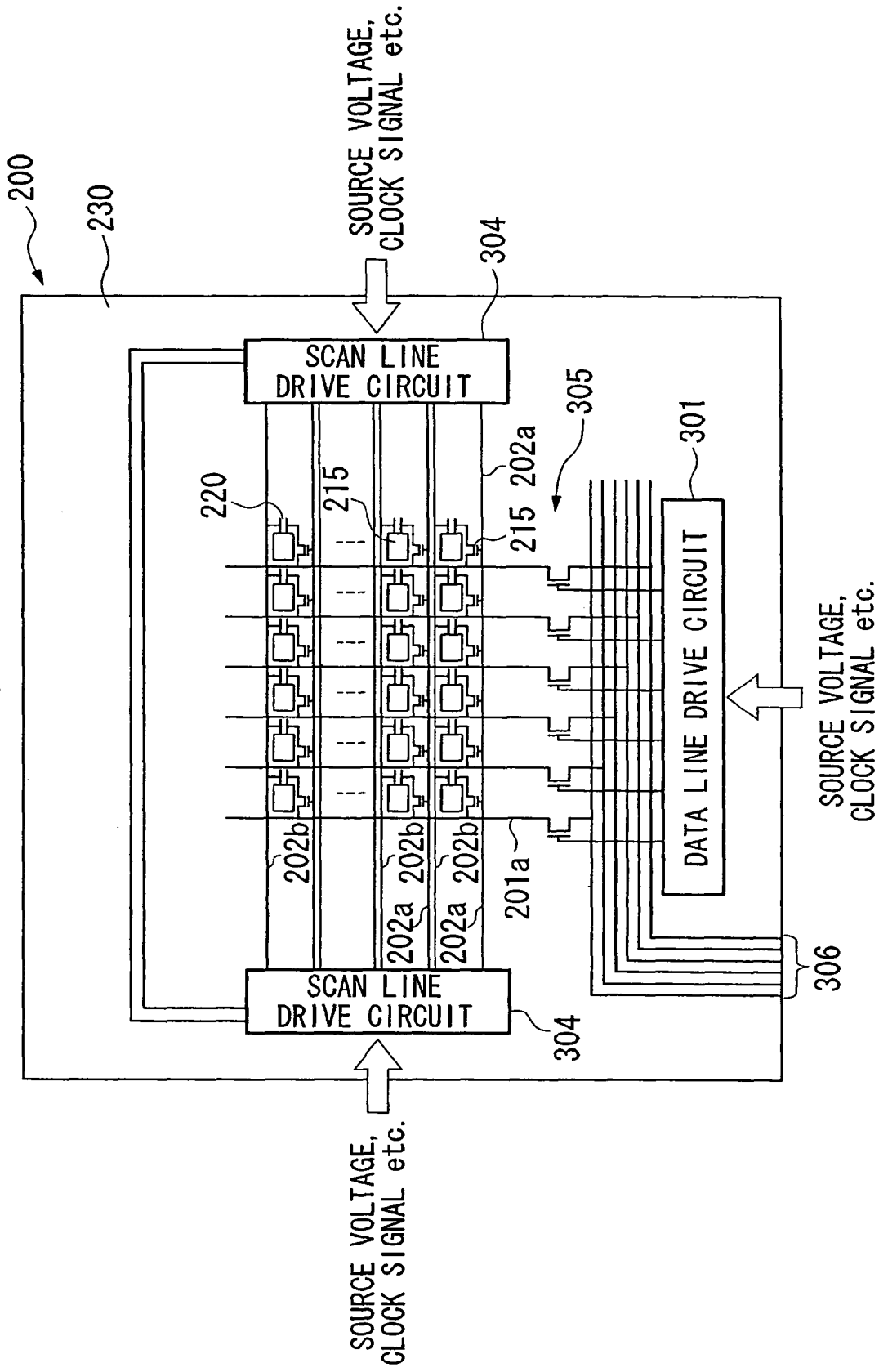

DROPLET DISCHARGE METHOD, DROPLET DISCHARGE APPARATUS, MANUFACTURING METHOD FOR LIQUID CRYSTAL DEVICE, LIQUID CRYSTAL DEVICE, AND ELECTRONIC APPARATUS

This is a Division of application Ser. No. 10/626,565 filed Jul. 25, 2003. The disclosure of the prior application is hereby incorporated herein by reference in its entirety.

BACKGROUND OF THE INVENTION

1. Field of the Invention

The present invention relates to a technique for discharging a liquid material from a discharge device, and arranging a specified quantity of liquid material on a substrate. More specifically, the present invention relates to a droplet discharge method and a droplet discharge apparatus used in a manufacturing process for an electrooptical device such as a liquid crystal device.

Priority is claimed on Japanese Patent Applications No. 2002-223151, filed Jul. 31, 2002, and No. 2003-198651, filed Jul. 17, 2003, the content of which is incorporated herein by reference.

2. Description of Related Art

As a technique for quantitatively arranging a specified quantity of liquid material on a substrate, there is known for example a technique in which a specified quantity of liquid material is continuously discharged by using a dispenser, and this is then arranged on the substrate, for example as is shown, in Japanese Patent Application Laid-Open (JP-A) No. 10-323601.

In the quantitative arrangement technique for the liquid material using a dispenser, however, it is difficult to control the discharged quantity of the liquid material and the location of the liquid material on the substrate highly accurately, and a nonuniform arrangement of the liquid material is likely to occur.

For example, a manufacturing process for a liquid crystal device includes a step for quantitatively arranging a liquid crystal on a substrate having electrodes formed thereon, and then adhering the substrate to another substrate. At this time, if nonuniform arrangement of the liquid material occurs, this may cause a drop in the display quality.

In view of the above situation, it is an object of the present invention to provide a droplet discharge method and a droplet discharge apparatus, which can reduce the consumption of a liquid material, and can uniformly arrange the liquid material on a substrate, without significantly decreasing the throughput. It is another object of the present invention to provide a manufacturing method for a liquid crystal device, which can realize low cost and improved quality, and a liquid crystal device. Moreover, it is another object of the present invention to provide electronic apparatus including a high quality liquid crystal device at a low cost.

SUMMARY OF THE INVENTION

The first aspect of the present invention is a droplet discharge method for discharging a liquid material from a discharge device and arranging the liquid material in a specified quantity on a substrate, the discharge device comprising a nozzle for discharging the liquid material in droplets, and the droplet discharge method has the steps of cleaning the nozzle using the liquid material, and arranging at least a part of the liquid material used for cleaning on the substrate.

In the droplet discharge method in this aspect, since the liquid material is discharged in droplets via the nozzle, the quantity and position of the liquid material to be arranged on the substrate can be finely controlled, thereby enabling uniform arrangement of the liquid material. Moreover, since at least a part of the liquid material used for cleaning the nozzle is directly arranged on the substrate, wasteful use of the liquid material can be avoided, and the consumption thereof can be reduced. In this case, since cleaning of the nozzle and the quantitative arrangement of the liquid material are conducted in parallel at least partly, the whole processing time can be shortened, thereby improving the throughput, as compared with a case where these are conducted separately.

In the droplet discharge method, the liquid material may be warmed to room temperature or higher. As a result, liquid material having a relatively high viscosity can be used.

The second aspect of the present invention is a manufacturing method for a liquid crystal device involving discharging a liquid crystal from a discharge device, and arranging the liquid crystal in a specified quantity on a first substrate, the discharge device comprising a nozzle for discharging the liquid crystal in droplets, and the manufacturing method has the steps of cleaning the nozzle using the liquid crystal, and arranging at least a part of the liquid crystal used for cleaning on the first substrate.

With the manufacturing method for the liquid crystal device, the quantity and position of the liquid crystal to be arranged on the first substrate can be finely controlled. Moreover, wasteful use of the liquid crystal can be avoided, and the consumption thereof can be reduced.

Furthermore, preferably a sealing material for adhering the first substrate to a second substrate is arranged on the first substrate, and a specified quantity of liquid crystal is arranged on the first substrate, away from the sealing material.

As a result, contact between the sealing material and the liquid crystal can be prevented at the time of arranging the liquid crystal, thereby preventing performance deterioration of the sealing material. Since the liquid crystal arranged on the substrate is discharged in droplets via the nozzle, the quantity and position of the liquid crystal to be arranged can be finely controlled, thereby reliably preventing contact.

In this case, it is desired that the liquid crystal be spread over a whole space between the first substrate and the second substrate, after these substrates are adhered to each other via the sealing material.

As a result, performance deterioration of the sealing material due to contact between the sealing material and the liquid crystal can be suppressed. For example, by spreading the liquid crystal over the whole space after the sealing material is dried to some extent, even if the sealing material and the liquid crystal come in contact with each other, there is little performance deterioration of the sealing material.

The third aspect of the present invention is a manufacturing method for a liquid crystal device involving discharging a liquid material from a discharge device to form a predetermined component on a substrate, the discharge device comprising a nozzle for discharging the liquid material in droplets, and the droplet discharge method has the steps of cleaning the nozzle using the liquid material, and arranging at least a part of the liquid material used for cleaning on the substrate.

With the manufacturing method for the liquid crystal device in this aspect, the quantity and position of the components to be formed on the substrate can be finely controlled. Moreover, wasteful use of the liquid material can be avoided, and the consumption thereof can be reduced.

Moreover, the component is an orientated film constituting a liquid crystal device or a protection film for a color filter, and the liquid material contains a constituent material for the orientated film or the protection film.

As a result, the quantity and position of the oriented film or the protection film to be formed on the substrate can be finely controlled. Moreover, wasteful use of the liquid material can be avoided, and the consumption thereof can be reduced.

The fourth aspect of the present invention is a droplet discharge apparatus which discharges a liquid material from a discharge device and arranges the liquid material in a specified quantity on a substrate, wherein the discharge device has a nozzle for discharging the liquid material in droplets, and the droplet discharge apparatus has a liquid material supply system which supplies the liquid material to the nozzle, and a measuring device which measures a quantity of the liquid material arranged on the substrate.

Since the droplet discharge apparatus in this aspect can execute the droplet discharge method by having the above-described configuration, the quantity and position of the liquid material to be arranged on the substrate can be finely controlled. Moreover, by cleaning the nozzle using the liquid material and arranging at least a part of the liquid material used for cleaning on the substrate as is, the consumption of the liquid material can be reduced, and the throughput can be improved.

Furthermore, the droplet discharge apparatus may have a temperature control device which warms the liquid material to room temperature or higher.

As a result, liquid material having a relatively high viscosity can be used.

In this liquid crystal device, a liquid crystal device has at least one component of a component group consisting of a liquid crystal layer, an oriented film, and a protection film for a color filter, wherein the droplet discharge apparatus is used to form at least one component of the component group.

In the liquid crystal device, being a fifth aspect of the present invention, the component is formed by using the droplet discharge device. As a result, the manufacturing cost can be reduced, and the performance can be improved.

An electronic apparatus, being a sixth aspect of the present invention, has the above described liquid crystal device. With this electronic apparatus, the manufacturing cost can be reduced, and the performance can be improved.

BRIEF DESCRIPTION OF THE DRAWINGS

FIG. 9 is an equivalent circuit diagram illustrating the configuration of an active matrix substrate used in the liquid crystal panel shown in FIG. 6.

DETAILED DESCRIPTION OF THE INVENTION

First Embodiment

Embodiments of the present invention will now be described, with reference to the drawings.

Figure 1:
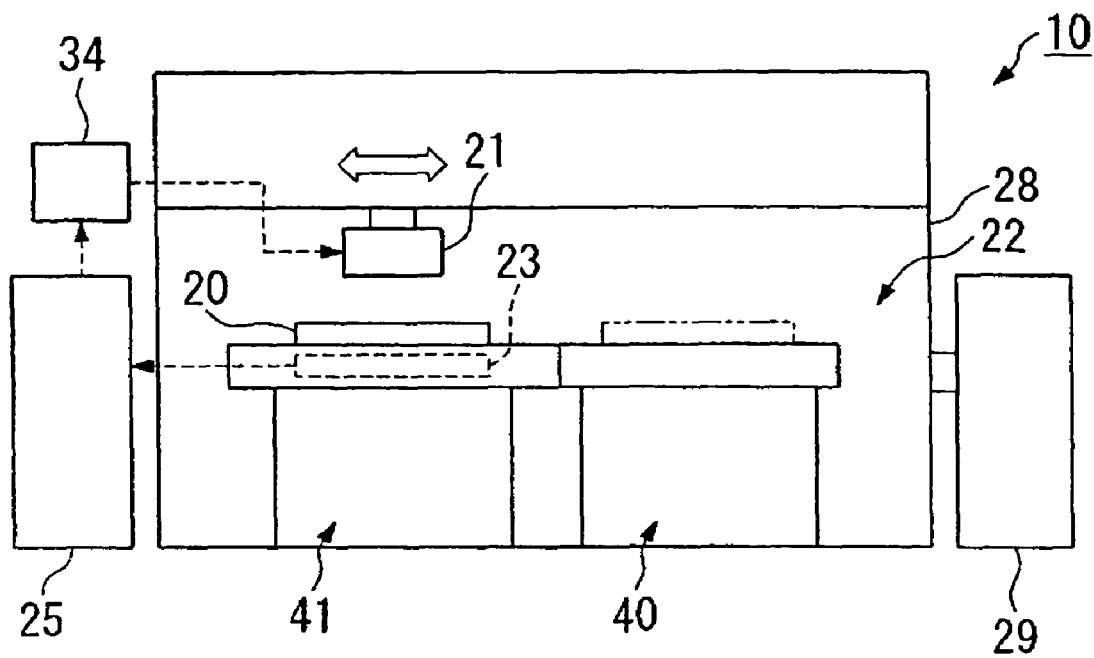
FIG. 1 is a diagram schematically illustrating one example of an embodiment of a droplet discharge apparatus of the present invention.

FIG. 1 schematically illustrates one example of an embodiment of a droplet discharge apparatus of the present invention. A droplet discharge apparatus 10 comprises a droplet discharge head 21 which discharges a liquid material toward a substrate 20, a substrate stage 22 on which the substrate 20 is mounted, a measuring device 23 which measures the weight of the liquid material arranged on the substrate 20, and a control unit 25 which controls these in an integrated manner. The droplet discharge head 21 and the substrate stage 22 are arranged in a chamber 28, and this chamber 28 comprises a thermostat 29, which controls the temperature therein.

For the substrate 20, various substrates may be used, such as a glass substrate, a silicon substrate, a quartz substrate, a ceramic substrate, a metal substrate, a plastics substrate, and a plastic film substrate. There is also included one in which a semiconductor film, a metal film, a dielectric film, or an organic film are formed on the surface of a substrate of these various materials, as a ground layer (base layer).

The droplet discharge head 21 is for discharging a liquid material (resist) from a nozzle by a liquid discharge method. As the liquid discharge method, various known techniques can be applied, such as a piezo method in which an ink is discharged by using a piezo device as a piezoelectric element, a method in which a liquid material is heated and discharged in a form of bubbles, and the like. Of these methods, the piezo method has an advantage in that it does not affect the composition of the material, since the liquid material is not heated. In this embodiment, the piezo method is used.

Figure 2:
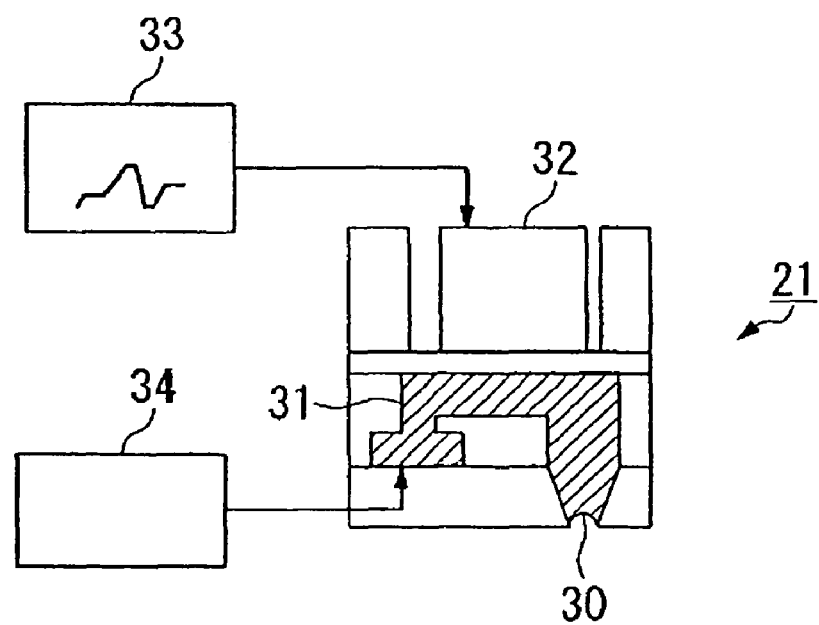
FIG. 2 is a diagram for explaining the discharge principle for a liquid material using a piezo method.

FIG. 2 is a diagram for explaining the discharge principle of a liquid material by the piezo method. In FIG. 2, a piezo device 32 is installed adjacent to a liquid chamber 31 for storing the liquid material. The liquid material is supplied to the liquid chamber 31 via a liquid material supply system 34 including a material tank for storing the liquid material. The piezo device 32 is connected to a drive circuit 33, and voltage is applied to the piezo device 32 via the drive circuit 33. By deforming the piezo device 32, the liquid chamber 31 deforms, to discharge the liquid material from the nozzle 30. At this time, by changing the value of the applied voltage, the distortion of the piezo device 32 is controlled, and by changing the frequency of the applied voltage, the distortion speed of the piezo device 32 is controlled. In other words, in the droplet discharge head 21, by controlling the applied voltage to the piezo device 32, discharge of the liquid material from the nozzle 30 is controlled.

Returning to FIG. 1, the droplet discharge head 21 is arranged above the substrate stage 22, so as to be able to move freely relative to the substrate stage 22.

The substrate stage 22 has a standby discharge section 40 in which cleaning of the droplet discharge head 21 is conducted, and a weight measuring section 41 which quantitatively arranges the liquid material. The operations of carrying in and out of a substrate 20 with respect to the substrate stage 22, and transfer of the substrate 20 between the standby discharge section 40 and the weight measuring section 41 are conducted by a transfer mechanism (not shown) comprising a transfer arm and the like.

The measuring device 23 comprises for example a load cell for measuring the weight of an object. In this example, the measuring device 23 is constituted so as to measure the weight of the substrate 20 mounted in the weight measuring section 41 on the substrate stage 22, and the measurement result is transmitted to the control unit 25. The control unit 25 stores the weight of the substrate 20 before the liquid material is arranged, and determines the weight of the liquid material arranged on the substrate 20, based on the measurement result transmitted from the measuring device 23 and the stored information.

The temperature in the chamber 28 is controlled by the thermostat 29 such that the viscosity of the liquid material to be used becomes a viscosity for favorable discharge from the droplet discharge head 21, based on a correlation between the properties of the liquid material, particularly, the viscosity of the liquid material, and the temperature. By controlling the temperature in the chamber 28 to room temperature or higher, for example, to a predetermined temperature within a range of from 30 to 70° C., the viscosity of liquid material having a high viscosity at room temperature can be decreased, thereby improving the discharge property and the flatness of the application film on the substrate. In the example, by controlling the temperature in the chamber 28, the liquid material is warmed, but the droplet discharge head or the substrate stage may be respectively warmed.

Figure 3A:
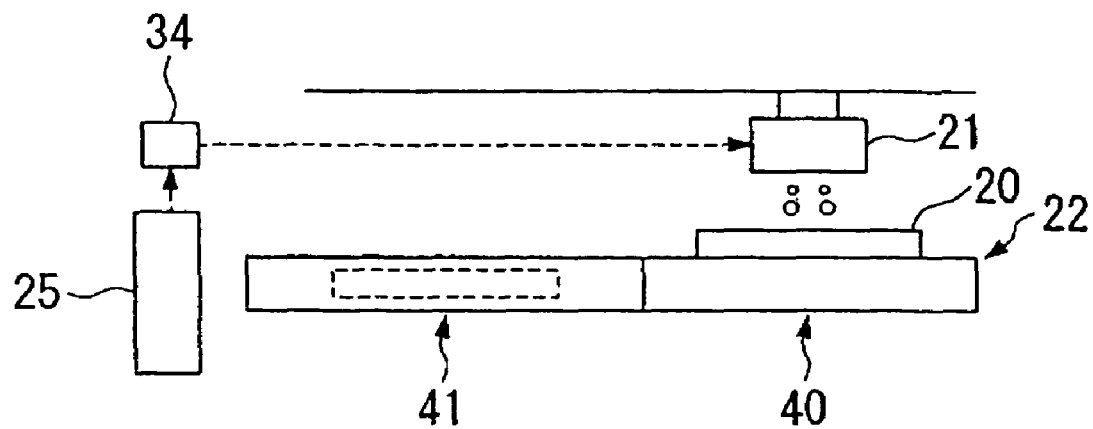
FIGS. 3A and 3B are diagrams illustrating an example in which a specified quantity of liquid material is quantitatively arranged on a substrate, by using the droplet discharge apparatus.
Figure 3B:
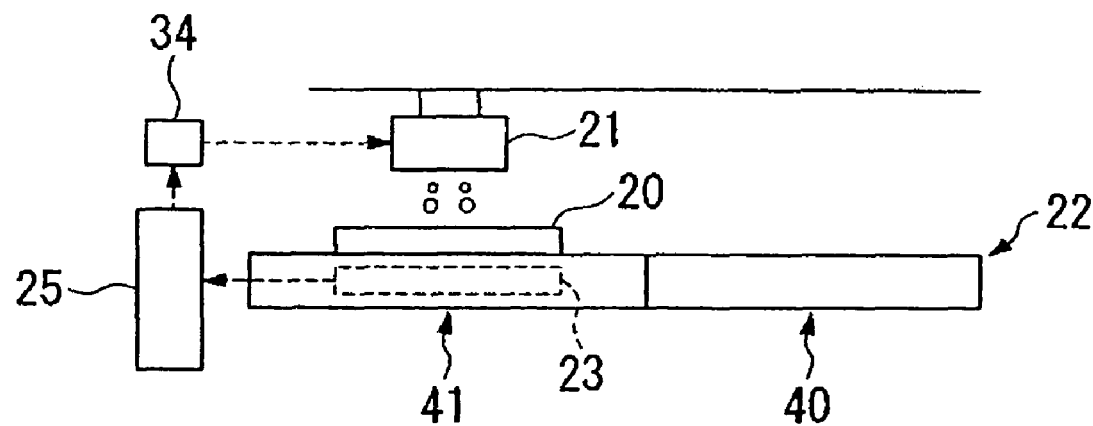

FIGS. 3A and 3B illustrate an example in which a specified quantity of liquid material is quantitatively arranged on the substrate 20, by using the droplet discharge apparatus 10 having the above configuration.

As shown in FIG. 3A, at first, the nozzle of the droplet discharge head 21 is cleaned (flushed). Cleaning of the nozzle of the droplet discharge head 21 is conducted by supplying the liquid material into the droplet discharge head 21 from the liquid material supply system 34 and discharging the liquid material from the nozzle. In other words, by vigorously pushing the liquid material through the droplet discharge head 21, clogging in the nozzle of the droplet discharge head 21, which occurs due to drying or the like, is dissolved. The liquid material used for cleaning is the same as the quantitatively arranged liquid material.

At the time of cleaning, the substrate 20 is mounted in the standby discharge section 40 on the substrate stage 22, the droplet discharge head 21 is arranged above the substrate 20, and the liquid material discharged from the droplet discharge head 21 is directly arranged on the substrate 20. The quantity of the liquid material used for cleaning is less than the specified quantity to be arranged on the substrate 20.

As shown in FIG. 3B, the substrate 20 is shifted from the standby discharge section 40 to the weight measuring section 41, and the cleaned droplet discharge head 21 is arranged above the substrate 20. The liquid material is then discharged repetitively in droplets from the droplet discharge head 21, to arrange the specified quantity of liquid material on the substrate 20.

At this time, the arrangement of the liquid material is conducted while weighing the weight of the substrate 20. In other words, at the time of arranging the liquid material, the measuring device 23 measures the weight of the substrate 20 mounted on the weight measuring section 41, and transmits the measurement result to the control unit 25. The control unit 25 calculates the weight of the liquid material arranged on the substrate 20, based on the measurement result transmitted from the measuring device 23 and the stored information relating to the weight of the substrate 20 before arranging the liquid material. When the weight of the liquid material has reached the specified quantity, based on the calculation result, discharge of droplets from the droplet discharge head 21 is stopped. As a result, the liquid material is arranged in the specified quantity on the substrate 20. When adjusting the gross weight of the liquid material to be discharged on the substrate, the weight can be favorably adjusted, by discharging the droplets in dots of a smaller size than that of the droplets normally discharged.

In the droplet discharge method in this embodiment, since at least a part of the liquid material used for cleaning the nozzle is directly arranged on the substrate, the liquid material used for cleaning can be included in the specified quantity, as a part of the liquid material to be arranged on the substrate. As a result, wasteful use of the liquid material is avoided, and the consumption thereof is reduced. In other words, since it is not necessary to dispose of the liquid material used for cleaning, there is an advantage in that this method does not harm the environment, and heretofore required liquid wastes processing cost is not necessary.

Measurement of the liquid material is performed after the cleaning, and hence even if clogging has occurred in the nozzle at the initial stage of cleaning, it does not affect the measurement accuracy. Moreover, in this case, since cleaning of the nozzle and the quantitative arrangement of the liquid material are conducted in parallel at least partly, the whole processing time can be shortened, thereby improving the throughput, as compared with a case where these are conducted separately.

At the time of cleaning the nozzle, the voltage applied to the piezo device may be set higher than that for at the time of normal discharge of the liquid material. In other words, in the conventional droplet discharge apparatus, control for finely adjusting the voltage applied to the piezo device at the time of discharging the liquid material is required, for accurately discharging the liquid material to desired application positions, for example, like the discharge operation of ink for forming a color filter. In the present invention, however, there is no problem even if a change such as in the trajectory occurs in the discharged liquid material.

Second Embodiment

An example in which the droplet discharge method is used for a manufacturing process for a liquid crystal device will be described below.

Figure 4:
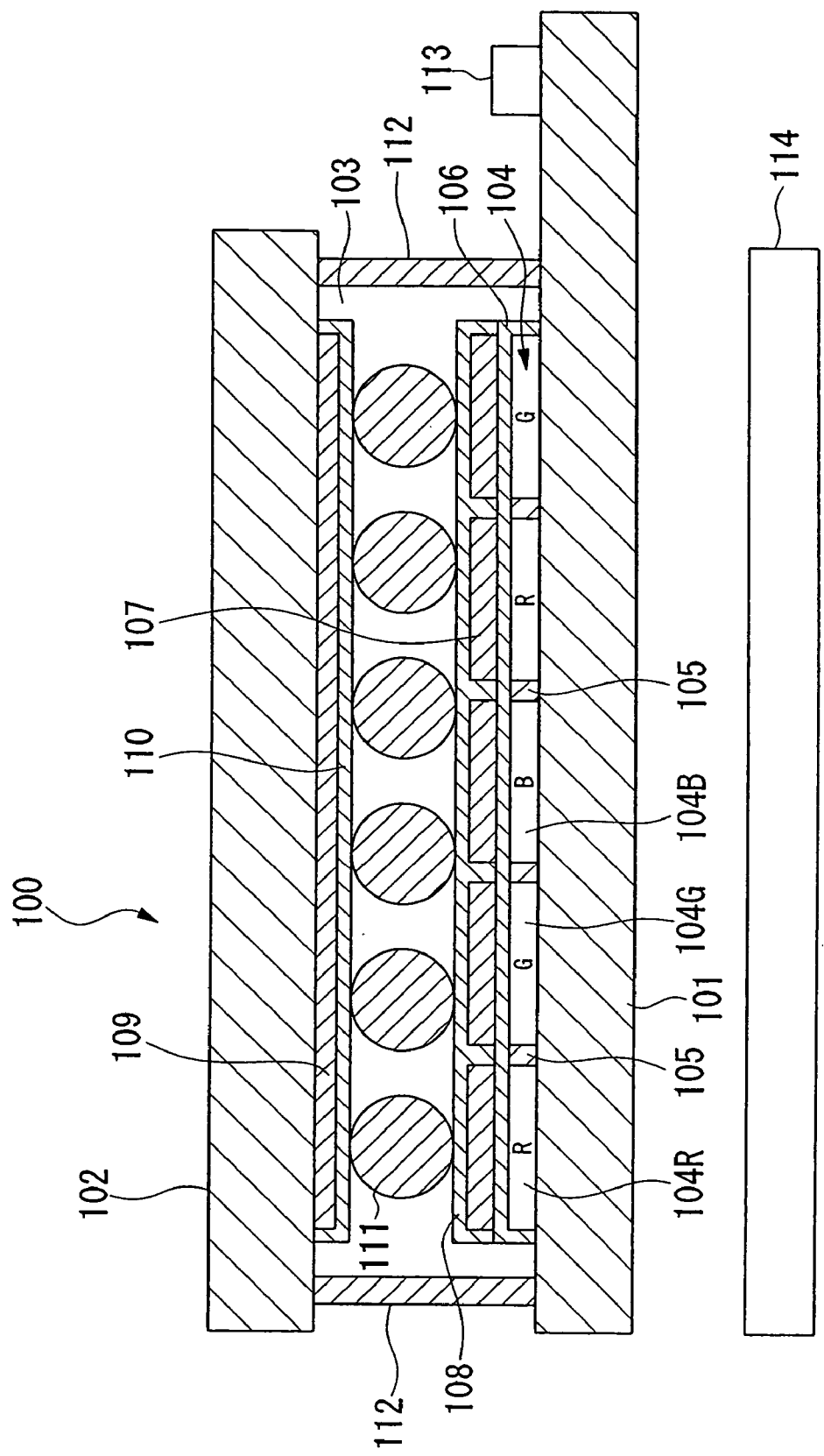
FIG. 4 is a diagram schematically illustrating one example of a sectional structure of a liquid crystal device (liquid crystal display).

FIG. 4 schematically illustrates a sectional structure of a passive matrix type liquid crystal device (a liquid crystal display).

The liquid crystal device 100 is of a transmission type, and has a structure such that a liquid crystal layer 103 comprising STN (Super Twisted Nematic) liquid crystal is placed between a pair of glass substrates 101 and 102. Moreover, the liquid crystal device 100 comprises a driver IC 113 for supplying a drive signal to the liquid crystal layer, and a backlight 114 as a light source.

A color filter 104 is arranged on the inner face of the glass substrate 101. The color filter 104 is formed by regularly arranging color layers 104R, 104G and 104B respectively consisting of colors of red (R), green (G) and blue (B). Between these color layers 104R (104G, and 104B), partitions 105 comprising a black matrix or a bank are formed. On the color filter 104 and the partition 105, an over coat film 106 is arranged for removing a difference in level formed by the color filter 104 and the partition 105 to flatten the surface.

A plurality of electrodes 107 are formed in stripes on the over coat film 106, and an oriented film 108 is formed thereon.

A plurality of electrodes 109 are formed in stripes on the inner face of the other glass substrate 102, so as to be orthogonal to the electrodes on the color filter 104 side, and an oriented film 110 is formed on these electrodes 109. The respective color layers 104R, 104G and 104B of the color filter 104 are arranged respectively at positions corresponding to the crossing position of the electrodes 109 on the glass substrate 102 and the electrodes 107 on the glass substrate 101. The electrodes 107 and 109 are formed of a transparent conductive material such as ITO (Indium Tin Oxide) or the like. Deflection plates (not shown) are respectively provided on the external faces of the glass substrate 102 and the color filter 104. Spacers 111 for maintaining a constant the gap (cell gap) between these substrates 101 and 102, and a sealing material 112 for cutting off the liquid crystal 103 from the outside air are arranged between the glass substrates 101 and 102. For the sealing material 112, for example, a thermosetting or photocurable resin is used.

In this liquid crystal device 100, at least one of; the oriented films 108 and 110, the over coat film 106, and the liquid crystal layer 103 is arranged on the glass substrate by using the droplet discharge method. As a result, the consumption of these materials can be suppressed, thereby enabling achievement of low cost.

Figure 5A:
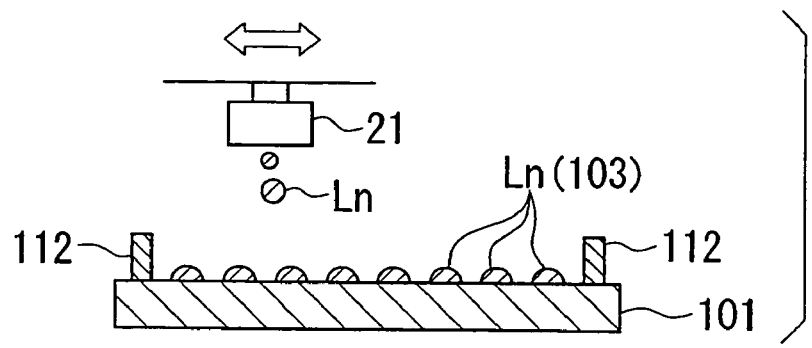
FIGS. 5A to 5D are diagrams schematically illustrating a manufacturing method for the liquid crystal device, FIG. 5A and FIG. 5B illustrating a process for quantitatively arranging a liquid crystal on a glass substrate, and FIG. 5C and FIG. 5D illustrating a process for sealing the liquid crystal.
Figure 5B:
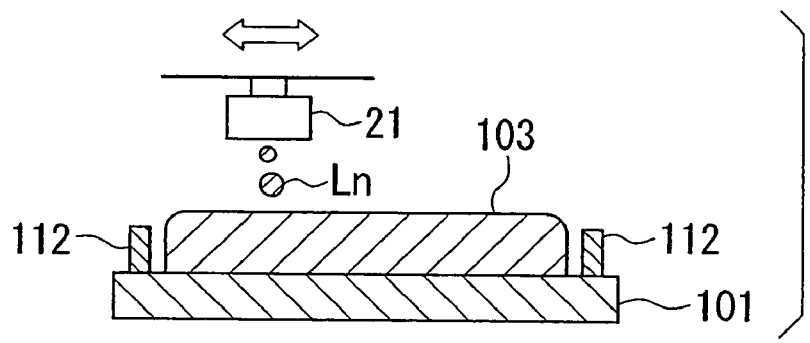
Figure 5C:
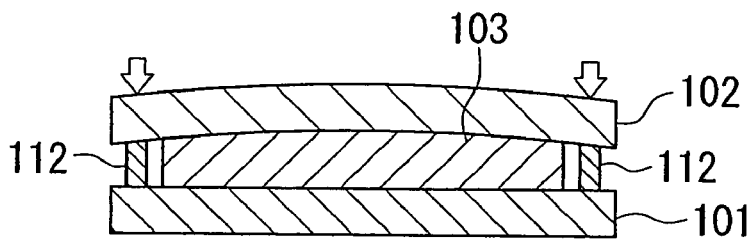
Figure 5D:
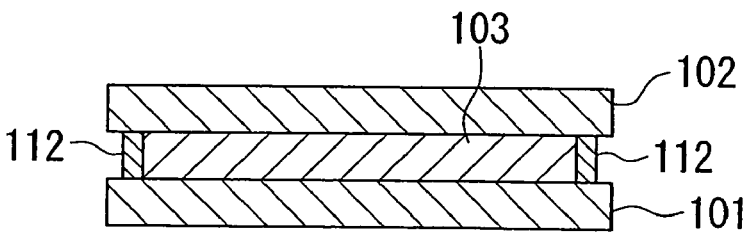

FIGS. 5A to 5D schematically illustrate a manufacturing method for the liquid crystal device 100, FIG. 5A and FIG. 5B illustrating a process for quantitatively arranging the liquid crystal on the glass substrate, and FIG. 5C and FIG. 5D illustrating a process for sealing the liquid crystal.

In FIGS. 5A to 5D, illustration of the aforementioned electrodes and the color filter on the glass substrate, and the spacers are omitted, for brevity of explanation.

In FIGS. 5A and 5B, in the process for quantitatively arranging the liquid crystal, the above described droplet discharge method is used to quantitatively arrange the specified quantity of liquid crystal on the glass substrate 101.

That is to say, as shown in FIG. 5A, the liquid crystal is discharged in droplets Ln from the nozzle of the droplet discharge head 21, while shifting the droplet discharge head 21 relative to the glass substrate 101, to arrange the droplets Ln on the glass substrate 101. As shown in FIG. 5B, the arrangement operation for the droplets Ln is repeated a plurality of times, until the liquid crystal arranged on the glass substrate 101 reaches the specified quantity. The specified quantity of the liquid crystal to be arranged on the glass substrate 101 is substantially the same as the capacity of the space formed between the glass substrates after sealing. In this embodiment, since the above described droplet discharge method is used, the liquid crystal arranged on the glass substrate 101 includes that used for cleaning (flushing) the droplet discharge head 21. As a result, wasteful use of the liquid crystal is avoided, and the consumption thereof can be reduced.

At the time of quantitatively arranging the liquid crystal, the discharge conditions of the droplets Ln, such as the volume and the location of the droplets Ln, are controlled. In this embodiment, since the liquid crystal is arranged on the substrate 20 in droplets Ln, the quantity and the position of the liquid crystal arranged on the substrate 20 can be finely controlled, thereby enabling uniform arrangement of the liquid crystal 103 on the substrate 20.

In this embodiment, as shown in FIG. 5A, the droplets Ln are arranged at positions away from the sealing material 112 on the substrate 20. Specifically, the droplets Ln are arranged on the glass substrate 101, such that the gap between the central position of the droplets Ln closest to the sealing material 112 and the sealing material 112 is wider than the total of an impact error of the droplets Ln and the radius of the droplets Ln. As a result, contact between the sealing material 112 and the liquid crystal 103 can be prevented, and performance deterioration of the sealing material 112 and deterioration of the liquid crystal 103 due to the uncured sealing material 112 contaminating the liquid crystal 103 can be prevented.

Next, in FIGS. 5C and 5D, the other glass substrate 102 is adhered under a reduced pressure, to the glass substrate 101 on which the specified quantity of liquid crystal 103 is arranged, via the sealing material 112.

Specifically, as shown in FIG. 5C, a pressure is mainly applied to the edge of the glass substrates 101 and 102 where the sealing materials 112 are arranged, to bond the sealing material 112 and the glass substrates 101 and 102. Then, after a predetermined time has passed and the sealing material 112 has dried to some degree, pressure is applied to the whole surface of the glass substrates 101 and 102, to allow the liquid crystal 103 to spread over the space put between both substrates 101 and 102.

In this case, when the liquid crystal 103 comes in contact with the sealing material 112, since the sealing material 112 has dried to some degree, there is little performance deterioration of the sealing material 112 accompanying the contact with the liquid crystal 103 or deterioration of the liquid crystal 103. The arrangement of the spacers 111 shown in FIG. 4 may be conducted after the liquid crystal 103 is arranged on the glass substrate 101, or may be conducted at the same time as arranging the liquid crystal 103. When the spacers 111 are arranged at the same time as arranging of the liquid crystal, the spacers may be intermixed with the liquid crystal.

After adhering the glass substrates 101 and 102 to each other, heat or light is applied to the sealing material 112 to cure the sealing material 112, so that the liquid crystal is sealed between the glass substrates 101 and 102.

The liquid crystal device manufactured in this manner can decrease the consumption of the liquid crystal, thereby enabling low cost. Moreover, there is a minimal drop in the display quality accompanying nonuniform arrangement of the liquid crystal, and poor sealing hardly occurs.

Moreover, the droplet discharge apparatus of the present invention is not limited to the above described passive matrix type liquid crystal device, and for example, may be preferably applied to the active matrix type liquid crystal device.

The configuration and operation of the liquid crystal panel used in the active matrix type liquid crystal device (liquid crystal display) will be described with reference to FIG. 6 to FIG. 9.

Figure 6:
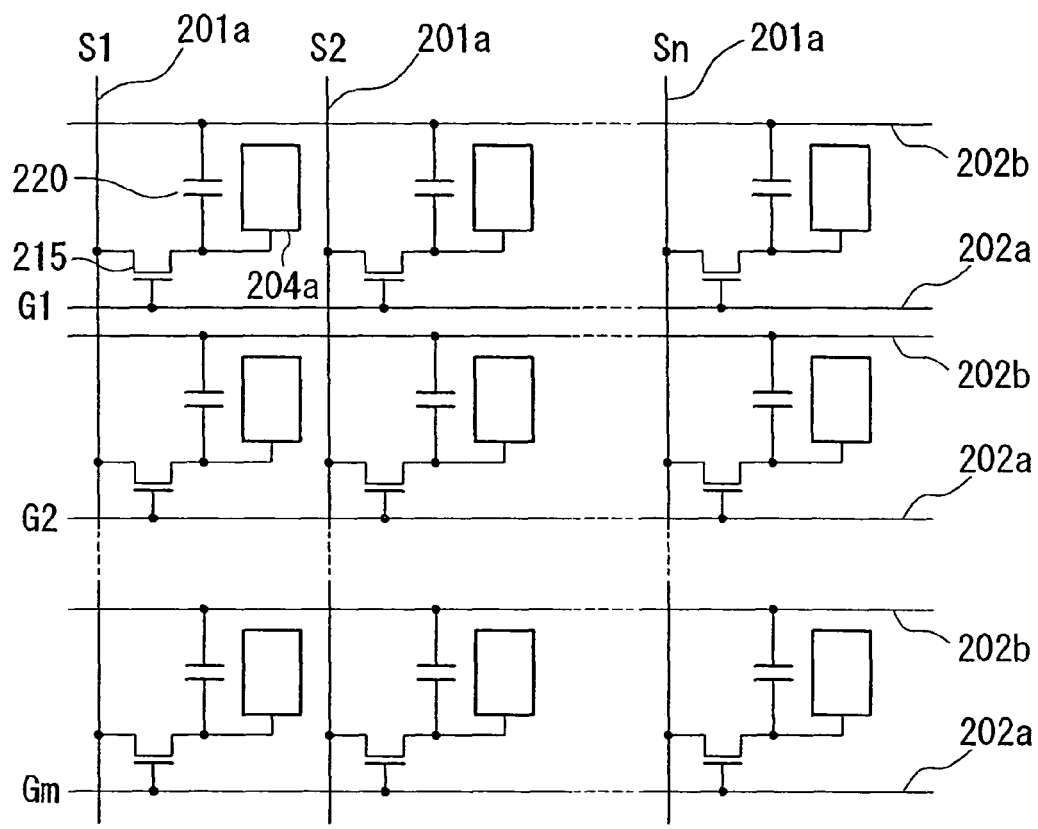
FIG. 6 is an equivalent circuit diagram of various elements and wiring in a plurality of pixels formed in matrix form for constituting a screen display area on a liquid crystal panel.

FIG. 6 is an equivalent circuit diagram of various elements and wiring in a plurality of pixels formed in matrix form for constituting a screen display area on a liquid crystal panel.

Figure 7:
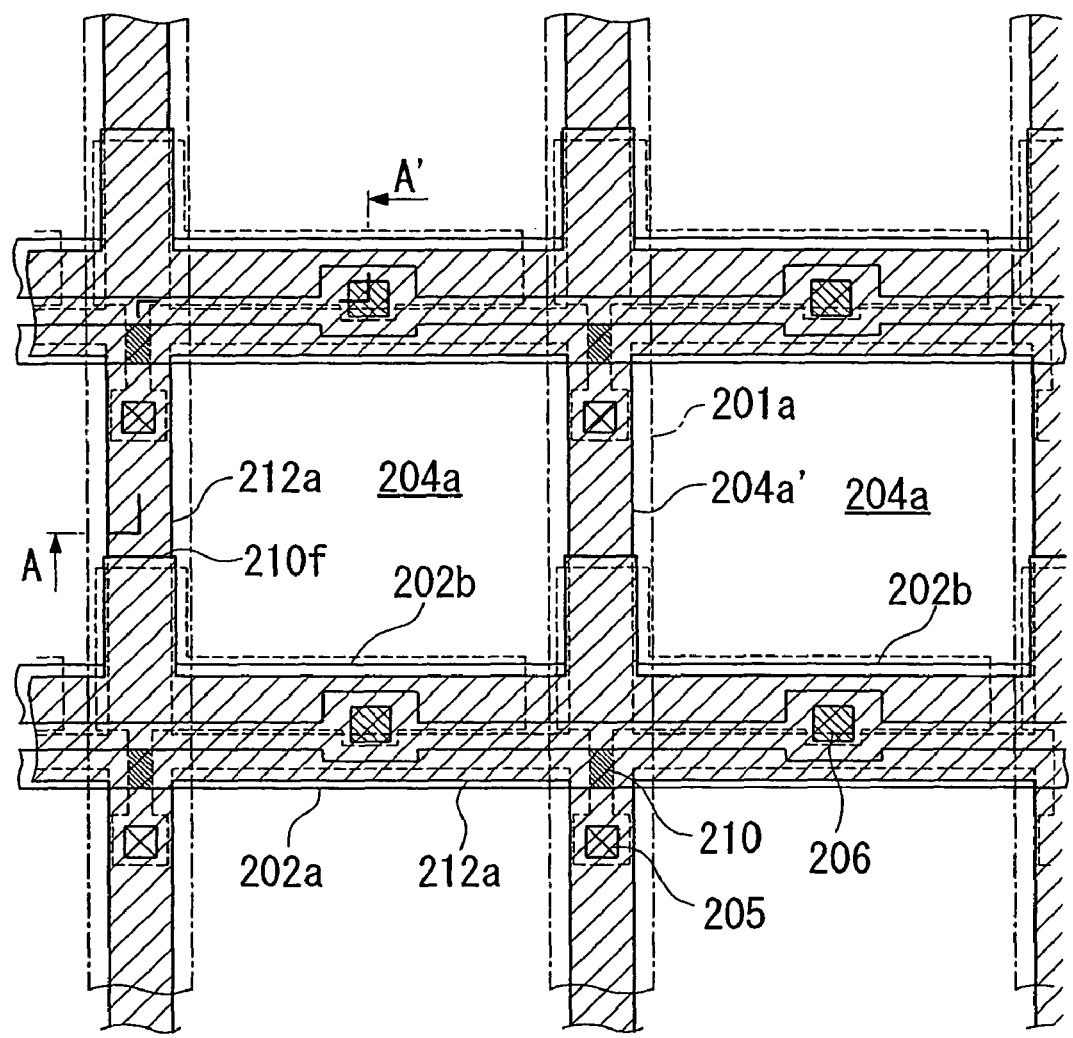
FIG. 7 is a plan view illustrating the configuration of respective pixels formed on an active matrix substrate in the liquid crystal panel shown in FIG. 6.

FIG. 7 is a plan view of adjacent pixels on the active matrix substrate in which a data line, a scan line, a pixel electrode and a shading film are formed.

Figure 8:
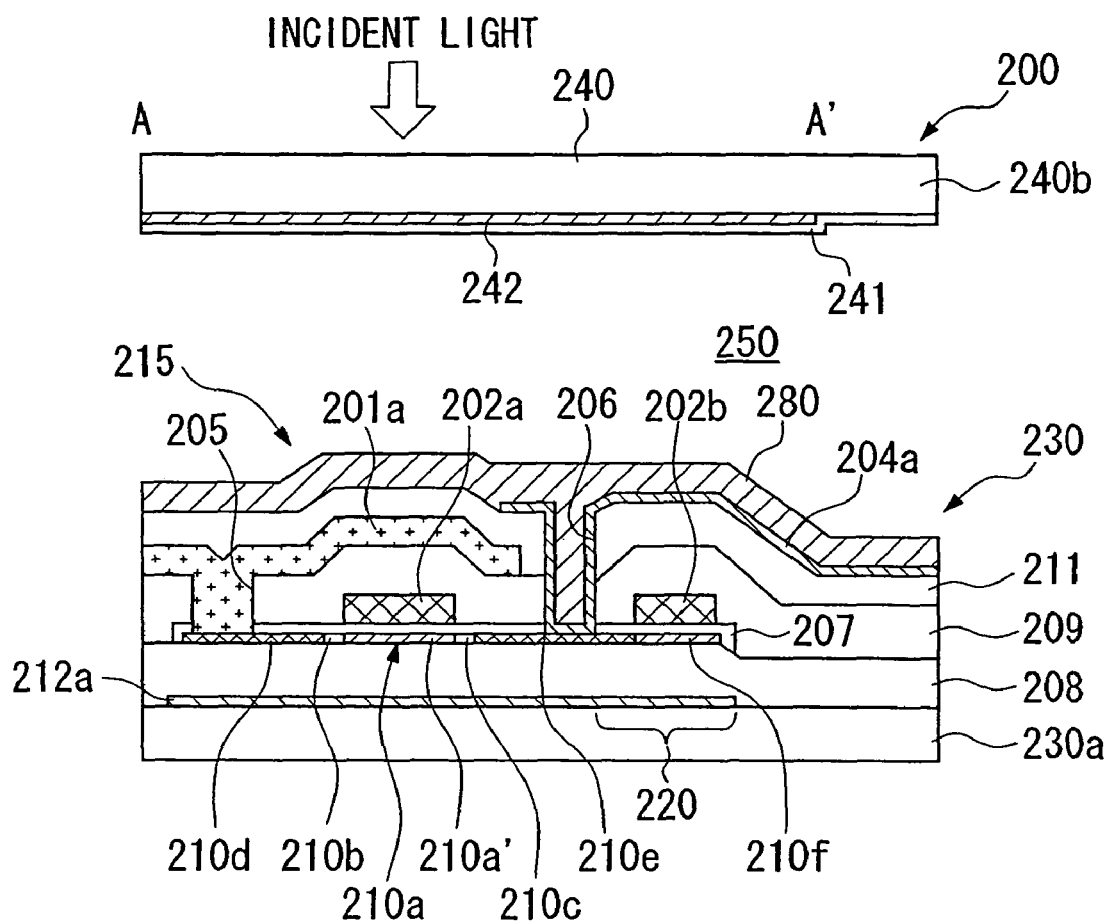
FIG. 8 is a sectional view at a position corresponding to line A-A' in FIG. 7.

FIG. 8 is a sectional view at a position corresponding to line A-A' in FIG. 7.

FIG. 9 is a plan view showing a two-dimensional wiring layout of an active matrix substrate.

In these figures, the scale for each layer and each member is made different to give a size so that each layer and each member is recognizable in the drawing.

In FIG. 6, in the screen display area of the liquid crystal panel, in each of a plurality of pixels formed in matrix form is formed a pixel switching TFT 215 for controlling a pixel electrode 204a, and a data line 201a to which pixel signals are supplied, is electrically connected to a source of the TFT 215. Pixel signals S1, S2, to Sn written to the data line 201a may be line-sequential supplied in this order, or may be supplied for each group, with respect to the associated adjacent plurality of data lines 201a. Furthermore, a scan line 202a is electrically connected to the gate of each TFT 215, and the configuration is such that scanning signals G1, G2, to Gm are line-sequential applied pulsewise to each of the scan lines 202a at a predetermined timing in this order. The pixel electrode 204a is electrically connected to the drain of a TFT 210, and by switching on the TFT 210 being a switching element, for a fixed period, the pixel signals S1, S2, to Sn supplied from the data line 201a are written to each pixel at a predetermined timing. The pixel signals S1, S2, to Sn of a predetermined level which are written to the liquid crystal via the pixel electrode 204a, are held for a fixed period between a counter electrode formed in a counter substrate described later and the pixel electrode 204a. The liquid crystal modulates light, enabling gradation display by changing the orientation and order of the molecular association change due to the applied voltage level. In a normally white mode, the incident light cannot pass through this liquid crystal portion, corresponding to the applied voltage, and in a normally black mode, the incident light can pass through this liquid crystal portion, corresponding to the applied voltage. As a result, light having a contrast corresponding to the pixel signal is emitted from the liquid crystal panel, as a whole.

In order to prevent leakage of the held pixel signals, it is common to add a storage capacitance 220 in parallel with the liquid crystal capacitance formed between the pixel electrode 204 and the counter electrode. For example, the voltage of the pixel electrode 204a is held by the storage capacitance 220 for a time longer by that for three figures, than the time while the source voltage is applied. As a result, the holding characteristic of the electric charge is improved, thereby realizing a liquid crystal display having a high contrast ratio. The method for forming the storage capacitance 220 may be used when the storage capacitance 220 is formed between a capacitor line 202b, being wiring for forming the capacitor, and the TFT 215, or when it is formed between the scan line 202a in the previous stage and the TFT 215.

In FIG. 7, a plurality of transparent pixel electrodes 204a (the outline is indicated by the dotted line portion 204a') is formed in matrix form for each pixel, on the active matrix substrate of the liquid crystal panel, and the data lines 201a, scan lines 202a and capacitor lines 202b are formed along the lengthwise and crosswise boundary areas of the pixel electrodes 204a. The data line 201a is electrically connected to a source area described later, of a semiconductor layer 210a comprising a polysilicon film, via a contact hole 205, and the pixel electrode 204a is electrically connected to a drain area described later, of the semiconductor layer 210a, via a contact hole 206. Moreover, the scan line 202a (gate electrode) passes so as to oppose a channel forming area (a hatched area downward slanting to the right) described later, of the semiconductor layer 210a.

As shown in FIG. 8, the liquid crystal panel 200 comprises an active matrix substrate 230 and a counter substrate 240 arranged opposite thereto. The base substance of the active matrix substrate 230 comprises a transparent substrate 230a such as a quartz substrate or a heat-resisting glass plate, and the base substance of the counter substrate 240 also comprises a transparent substrate 230a such as a quartz substrate or a heat-resisting glass plate. Pixel electrodes 204a are provided on the active matrix substrate 230, and an oriented film 280, which has been subjected to predetermined orientation processing such as rubbing processing, is formed on the upper side thereof. The pixel electrodes 204a comprise, for example, a transparent conductive thin film such as ITO. The oriented film comprises, for example, an organic thin film such as polyimide thin film.

On the active matrix substrate 230, there are formed pixel switching TFTs 215 for controlling switching of the respective pixel electrodes 204a, at positions adjacent to the respective pixel electrodes 204a. The TFT 215 shown here has an LDD (Lightly Doped Drain) structure, and comprises a scan line 202a (gate electrode), a channel forming area 210a' in a semiconductor film 210a where a channel is formed by an electric field of a scanning signal supplied from the scan line 202a, a gate insulating film 207 for insulating between the scan line 202a and the semiconductor layer 210a, a data line 201a (source electrode), a low-density source area (source side LDD area) 210b and a low-density drain area (drain side LDD area) 210c in the semiconductor layer 210a, and a high-density source area 210d and a high-density drain area 210e in the semiconductor layer 210a. To the high-density drain area 210e is electrically connected a corresponding one of the plurality of pixel electrodes 204a. As described below, the source areas 210b and 210d, and the drain areas 210c and 201e are formed by doping an n-type or p-type dopant of a predetermined density corresponding to a case for forming an n-type channel or forming a p-type channel in the semiconductor layer 210a. The TFT of the n-type channel has an advantage in that the operation speed is high, and this is frequently used for the pixel switching TFT.

The data line 201a (source electrode) comprises, for example, a metal film such as aluminum, or an alloy film such as metal silicide. On the scan line 202a (gate electrode), the gate insulating film 207 and a base protection film 208, there is formed first interlaminar insulating film 209 in which a contact hole 205 leading to the high-density source area 210d, and a contact hole 206 leading to the high-density drain area 210e are respectively formed. The data line 201a (source electrode) is electrically connected to high-density source area 210d via the contact hole 205 leading to the source area 210d. Moreover, a second interlaminar insulating film 211 is formed on the data line 201a (source electrode) and the first interlaminar insulating film 209. Since the pixel electrode 204a is formed on the second interlaminar insulating film 211, the contact hole 206 leading to the high-density drain area 210e is formed in the gate insulating film 207, the first interlaminar insulating film 209 and the second interlaminar insulating film 211. As a result, the pixel electrode 204a is electrically connected to the high-density drain area 210e via the contact hole 206 leading to the high-density drain area 210e. The pixel electrode 204a and the high-density drain area 210e may be electrically connected, via an aluminum electrode simultaneously formed with the data line 201a or a polysilicon electrode simultaneously formed with the scan line 202a.

The TFT 215 preferably has the LDD structure as described above, but may have an offset structure in which impurity ion implantation is not conducted in the area corresponding to the low-density source area 210b and the low-density drain area 210c. Moreover, the TFT 215 may be a self-alignment type TFT in which impurity ions are implanted at a high density, using the gate electrode 202a as a mask, to form the high-density source and drain areas in a self-aligned manner.

In this embodiment, there is used a single gate structure in which only one gate electrode (data line 202a) of the TFT 215 is arranged between the source and drain areas 210b and 210e, but two or more gate electrodes may be arranged therebetween. At this time, the same signal is applied to the respective gate electrodes. When the TFT is formed of at least dual gates (double gates) or triple gates, a leak current at the junction of the channel and the source and drain areas can be prevented, thereby enabling a reduction of current at the off time. If at least one of these gate electrodes has the LDD structure or the offset structure, the OFF-state current can be further reduced, and a stable switching element can be obtained.

In this embodiment, the gate insulating film 207 of the TFT 215 is extended from a position facing the gate electrode 202a and is used as a dielectric film, and the semiconductor 210a is extended as a first electrode 210f. Moreover, a part of the capacitor line 202b facing thereto is used as a second electrode, to form the storage capacitance 220. In other words, the high-density drain area 210e of the semiconductor 210a is extended up to below the data line 201a and the scan line 202a, and is arranged opposite to the capacitor line 202b via the gate insulating film 207 (dielectric film) along the data line 201a and the scan line 202a, as the first electrode (semiconductor layer) 210f. The insulating film 207 as the dielectric for the storage capacitance 220 is nothing else but the gate insulating film 207 of the TFT 215 formed on the polysilicon film by high-temperature oxidation, and hence, a thin and highly pressure-resistant insulating film can be obtained. Therefore, the storage capacitance 220 can be formed as a large capacity storage capacitance with a relatively small area. As a result, a space away from an opening area including the area below the data line 201a and the area parallel with the scan line 202a (that is, the area where the capacitor line 202b is formed) can be effectively utilized, to increase the storage capacitance with respect to the pixel electrode 204a.

In the active matrix substrate 230 constructed in this manner, as shown in FIG. 7 and FIG. 8, though the data line 201a, the scan line 202a and the capacitor line 202b pass through the boundary area between the adjacent pixel electrodes 204a, if light leaks through this wiring, or through a gap between this wiring and the pixel electrode 204a, the display quality deteriorates. Therefore, in this embodiment, between the transparent substrate 230b, being the base substance of the active matrix substrate 230 and the base protection film 208, there is formed a shading film 212a (a hatched area downward slanting to the left in FIG. 7) comprising Ti (titanium), Cr (chromium), W (tungsten), Ta (tantalum), Mo (molybdenum) or Pd (palladium), being a high melting metal or the alloy thereof, along the boundary area lengthwise and crosswise of the respective pixel electrodes 204a. This shading film 212a is formed, as seen in plan view, at positions overlapping on the areas where the TFT 215 is formed including the channel forming area of the semiconductor layer 210a, the data line 201a, the scan line 202a and the capacitor line 202b, as seen from the backside of the active matrix substrate 230.

On the other hand, a counter electrode 241 is formed over the whole surface of the counter substrate 240, and an oriented film (not shown), which has been subjected to predetermined orientation processing such as rubbing processing, is formed on the surface thereof. The counter electrode 241 is also formed from a transparent conductive thin film such as an ITO film. Moreover, the oriented film on the counter substrate 240 is also formed from an organic film such as a polyimide film. A counter substrate side shading film 242 is formed in matrix form on the counter substrate 240, in the area other than the opening area of each pixel. As a result, the incident light from the counter substrate 240 side does not reach the channel forming area 210a' and the LDD areas 210b and 210c in the semiconductor layer 210a. The shading film 242 on the counter substrate side has functions of improving the contrast and preventing color mixture of coloring materials.

The active matrix substrate 230 and the counter substrate 240 constructed as described above are arranged such that the pixel electrode 204a faces the counter electrode 241, and the liquid crystal 250 is sealed in the space between these substrates and sealed by a sealing material described later, and held between these substrates. The liquid crystal 250 takes a predetermined orientation condition due to the oriented film in a condition where the electric field from the pixel electrode 204*a* is not applied. The liquid crystal 250 is formed by, for example, mixing one or several kinds of nematic liquid crystals. The sealing material is an adhesive comprising a photoresist or a thermosetting resin for adhering the active matrix substrate 230 and the counter substrate 240 at the periphery thereof, and spacers such as glass fibers or glass beads are mixed as gap materials for maintaining the distance between the both substrates at a predetermined value.

In the liquid crystal panel 200 constructed as described above, the active matrix substrate 230 is constructed as shown in FIG. 9. A data line drive circuit 301 and a scan line drive circuit 304, which are formed by using the TFT, are formed on the active matrix substrate 230, and these data line drive circuit 301 and scan line drive circuit 304 are electrically connected to a plurality of data lines 201*a*, scan lines 202*a* and capacitor lines 202*b*, respectively. A sampling circuit 305 is formed on the active matrix substrate 230, and to this sampling circuit 305 are supplied image signals converted to an immediately displayable format, from a control circuit (not shown) via an image signal line 306. Therefore, the data line drive circuit 301 drives the sampling circuit 305 at the same time as when the scan line drive circuit 304 sequentially transmits scanning signals pulsewise to the scan line 202*a*, to thereby transmit a signal voltage corresponding to the image signal to the data line 201*a*.

As a result, in FIGS. 6, 8 and 9, the pixel signals S1, S2, to Sn are held in the respective pixels for a fixed period between the pixel electrode 204*a* and the counter electrode on the counter substrate 240, and the liquid crystal 250 changes its orientation and order of the molecular association due to the voltage level applied for each pixel. Therefore, of the incident light (incident light L1) from the counter substrate 240 side, only the light incident to the transmittable liquid crystal portion is emitted from the active matrix substrate 230, thereby enabling a predetermined display.

The manufacturing method for the active matrix substrate 230 for the liquid crystal display will be described, with reference to FIG. 10 to FIG. 14.

FIG. 10 to FIG. 14 are process sectional views illustrating the manufacturing method for the active matrix substrate 230. In FIGS. 10 to 14, sections at a position corresponding to the line A-A' in FIG. 7 are shown.

Figure 10A:
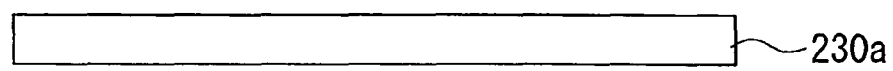
FIGS. 10A to 10C are process sectional views illustrating the process of a manufacturing method for the active matrix substrate of the liquid crystal panel.

As shown in FIG. 10A, a large substrate 230*a* from which many active matrix substrates 230 can be formed is prepared. The large-size substrate 230*a* may be subjected to heat treatment in an inert gas atmosphere such as N₂ (nitrogen) and in a high temperature atmosphere of from about 900° C. to about 1300° C. in a vertical diffusion furnace, and pre-treated so that there is little distortion in the high temperature process executed later (heat treatment process). In other words, the large-size substrate 230*a* is heat-treated beforehand at a temperature equal to or higher than the highest temperature in the manufacturing process (in this embodiment, at a temperature of 1150° C. at the time of forming the gate insulating film). For example, when the highest temperature in the manufacturing process is 1150° C., then in this pretreatment process, the large-size substrate 230*a* is heated at about 1150° C. for 30 seconds to 30 minutes. The temperature of 1150° C. is a temperature close to the distortion point for the material constituting the large-size substrate 230*a*.

Figure 10B:
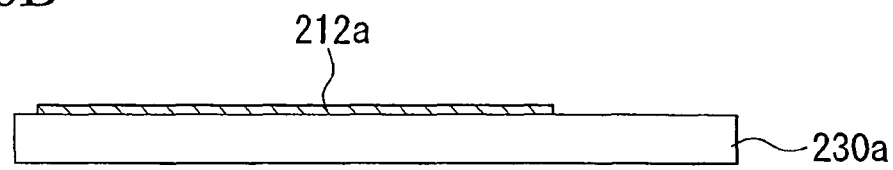

After a single metal of a high melting metal or the alloy thereof, such as Ti, Cr, W, Ta, Mo or Pd is formed by sputtering or the like on the whole surface of the large-size substrate 230*a* to a film thickness of from 1000 angstroms to 3000 angstroms (film forming process), a resist mask is formed on the metal film by using the photolithographic technique, and the metal film is etched via the resist mask, to form a shading film 212*a* as shown in FIG. 10B.

The shading film 212*a* is formed so as to cover at least a part of the area of the semiconductor layer in the TFT 215, where the channel area 210*a*, the source areas 210*b* and 210*d*, the drain areas 210*c* and 210*e*, the data line 201*a*, the scan line 202*a* and the capacitor line 202*b* are to be formed (see FIGS. 7 and 8), as seen from the backside of the large-size substrate 230*a*.

Figure 10C:
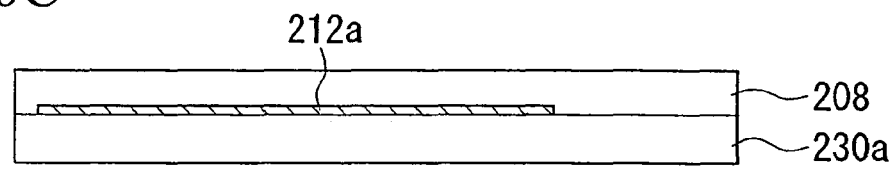

As shown in FIG. 10C, the base protective film 208 comprising a silicate glass film such as NSG (non-silicate glass), PSG (phosphorus silicate glass), BSG (boron silicate glass), or BPSG (boron phosphorus silicate glass), a silicon nitride film or a silicon oxide film is formed on the shading film 212*a*, using for example a TEOS (tetraethyl orthosilicate) gas, a TEB (tetraethyl borate) gas, or a TMOP (tetramethyloxy phosphate) gas by a normal pressure or low pressure chemical vapor deposition (CVD) method. The film thickness of the base protective film 208 is from about 500 angstroms to 15000 angstroms, and more preferably, from about 6000 angstroms to 8000 angstroms. Alternatively, the base protective film 208 having a multilayer structure of a thickness of about 2000 angstroms may be formed by depositing a high temperature silicon oxide film (HTO film) or a silicon nitride film in a relatively thin thickness of about 500 angstroms by the low pressure CVD method or the like. Moreover, a flat film may be formed by subjecting to a spin-coating SOG (spin-on-glass) process or a CMP (Chemical Mechanical Polishing) process, overlapped on or instead of the silicate glass film. If the upper face of the base protective film 208 is flattened by the spin coating process or the CMP process, the TFT 215 can be easily formed thereon. The base protective film 208 may be subjected to annealing processing at about 900° C. in a hot wall device, to prevent contamination and to flatten the base protective film 208 (heat treatment process).

Figure 11A:
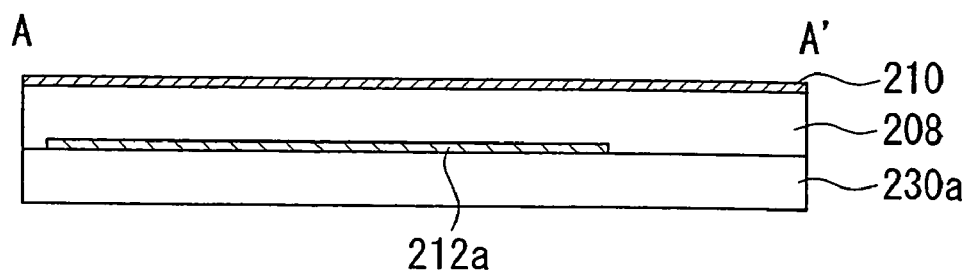
FIGS. 11A to 11D are process sectional views of respective processes conducted following the process shown in FIG. 10C, in the manufacturing method for the active matrix substrate of the liquid crystal panel.

Then, as shown in FIG. 11A, an amorphous silicon film is formed on the base protective film 208 by low pressure CVD (for example, by CVD at a pressure of about 30 Pa to 40 Pa), using a monosilane gas or disilane gas at a flow rate of from about 400 cc/min. to about 600 cc/min. in a relatively low temperature environment of from about 450° C. to about 550° C., and preferably of about 500° C. Thereafter, by applying annealing processing at a temperature of from about 600° C. to about 700° C. for about one hour to about ten hours, more preferably, from about four hours to about six hours in a nitrogen atmosphere in the hot wall device, a polysilicon film 260 is grown from solid phase to a thickness of from about 500 angstroms to about 2000 angstroms, and preferably to a thickness of about 1000 angstroms.

At this time, when the pixel switching TFT 215 is an n-channel type, a dopant of a fifth group element such as Sb (antimony), As (arsenic) or P (phosphorus), may be doped slightly in the channel forming area by ion implantation or the like. When the pixel switching TFT 215 is a p-channel type, a dopant of a third group element such as B (boron), Ga (gallium) or In (indium), may be doped slightly in the channel forming area by ion implantation or the like. The polysilicon film 260 may be directly formed by the low pressure CVD method or the like, and not through the amorphous silicon film. Alternatively, silicon ions may be implanted in the polysilicon film deposited by the low pressure CVD method or the like to make the film amorphous, and the film then recrystallized by annealing processing or the like, to form the polysilicon film 260.

Figure 11B:
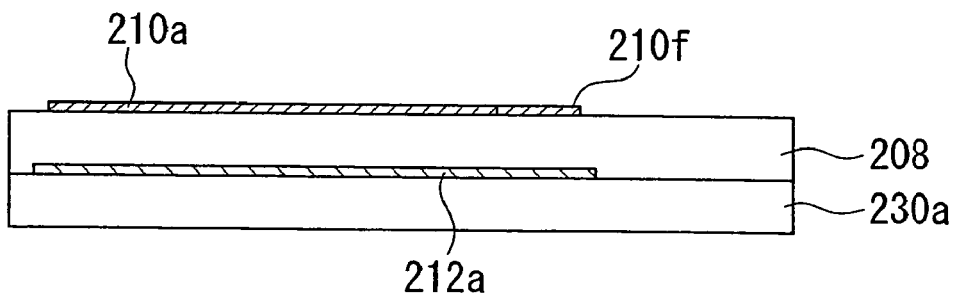

As shown in FIG. 11B, the semiconductor layer 210a having a pattern shown in FIG. 7 is formed by the photolithographic process or etching process. In other words, in the area where the capacitor line 202b is formed under the data line 201a, and in the area where the capacitor line 202b is formed along the scan line 202a, the first electrode 210f extended from the semiconductor layer 210a constituting the TFT 215 is formed.

Figure 11C:
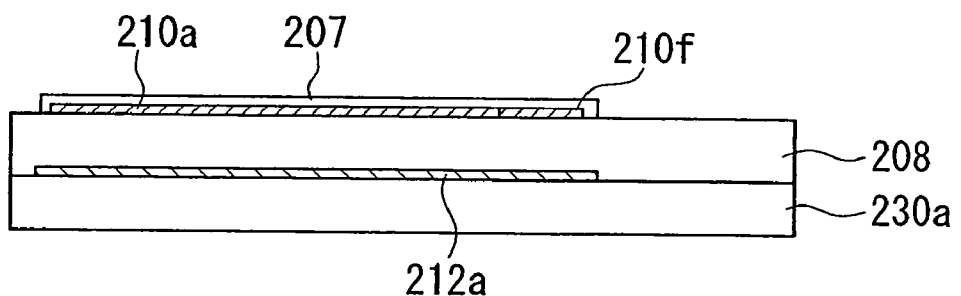

As shown in FIG. 11C, the first electrode 210f is subjected to thermal oxidation at a temperature of from about 900° C. to about 1300° C., and preferably at a temperature of about 1150° C. in the hot wall device, together with the semiconductor layer 210a constituting the TFT 215, to form a relatively thin thermally oxidized silicon film of about 300 angstroms (heat treatment process), and then a high temperature silicon oxide film (HTO film) and the silicon nitride film are deposited in a relatively thin thickness of about 500 angstroms by the low pressure CVD method or the like (film-forming process), to form the gate insulating film 207 having a multi-layer structure, and a dielectric film for forming the storage capacitance. As a result, the thickness of the first electrode 210f becomes about 300 angstroms to about 1500 angstroms, and more preferably, about 350 angstroms to about 500 angstroms, and the thickness of the dielectric film for forming the storage capacitance (gate insulating film 207) becomes about 200 angstroms to about 1500 angstroms, and more preferably, about 300 angstroms to about 1000 angstroms.

Here the polysilicon film 210 may form the gate insulating film 207 having a single layer structure by only thermal oxidation under a temperature condition of about 1150° C. in a vertical diffusion furnace (heat treatment process).

Moreover, P ions are doped on the semiconductor layer portion, which becomes the first electrode 210f, of the polysilicon layer 210, at a dose of about $3\times10^{10}$/cm$^2$ so as to have a low resistance.

Figure 11D:
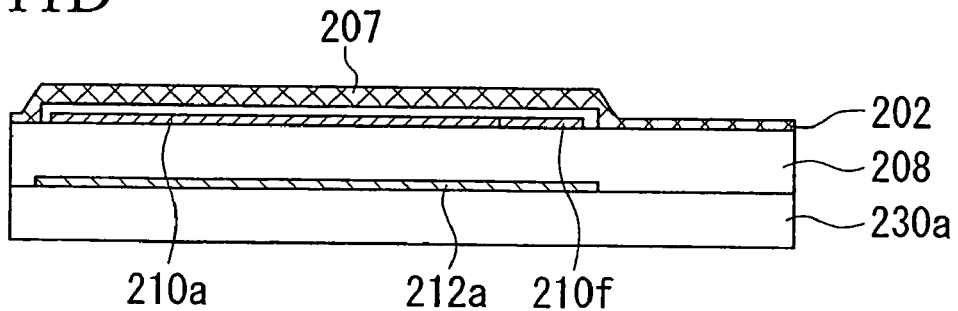

Then, as shown in FIG. 11D, after the polysilicon film 202 is deposited by the low pressure CVD method or the like, phosphorus (P) is thermally diffused, to render the polysilicon film 202 conductive. Alternatively, a doped silicon film may be used, in which P ions are implanted simultaneously with film forming of the polysilicon film 202.

Figure 12A:
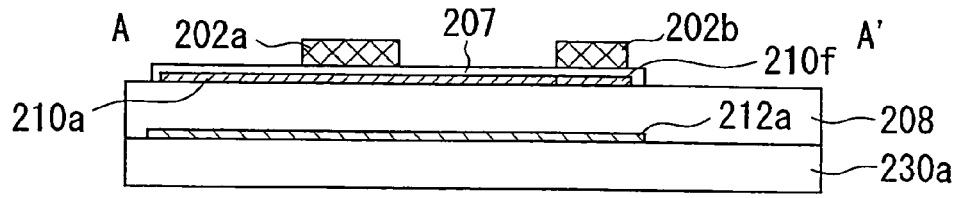
FIGS. 12A to 12E are process sectional views of respective processes conducted following the process shown in FIG. 11D, in the manufacturing method for the active matrix substrate of the liquid crystal panel.

Next, as shown in FIG. 12A, the scan line 202a (gate electrode) and the capacitor line 202b having the pattern shown in FIG. 7 are formed by the photolithographic process using a resist mask, etching process or the like. The film thickness of these capacitor lines 202b and scan lines 202a is for example about 3500 angstroms.

Figure 12B:
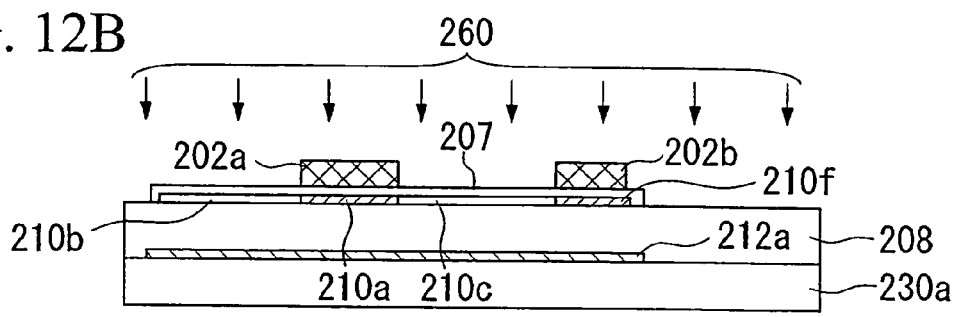

Then, as shown in FIG. 12B, when the TFT 215 shown in FIG. 8 is an n-channel type having the LDD structure, a dopant 260 of a fifth group element such as P, is doped at a low density (for example, P ions are doped at a dose of about $1\times10^{13}$/cm$^2$ to $3\times10^{13}$/cm$^2$), using the scan line 202 (gate electrode) as a diffusion mask, to form the low-density source area 210b and the low-density drain area 210c on the semiconductor layer 210a. As a result, the semiconductor layer 210a under the scan line 202a (gate electrode) becomes the channel forming area 210a'. By this doping of impurities, the capacitor line 202b and the scan line 202a are rendered to have a low resistance.

Figure 12C:
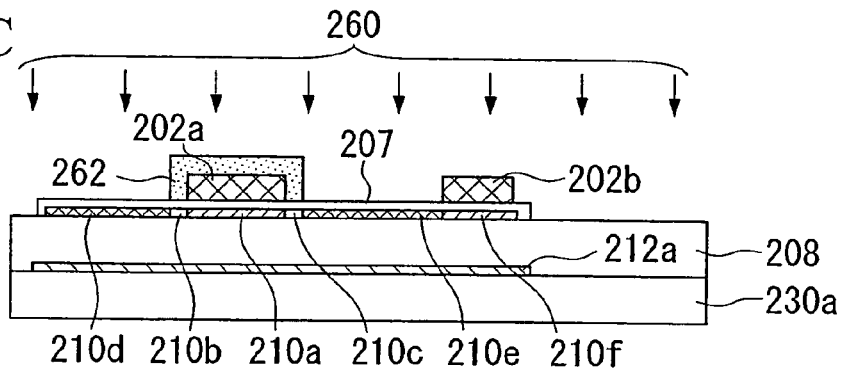

Subsequently, as shown in FIG. 12C, after a resist mask 262 is formed on the scan line 202a (gate electrode) with a wider mask than the width of the scan line 202a (gate electrode), to form the high-density source area 210d and the high-density drain area 210e in the TFT 215, a dopant 261 of a fifth group element such as P, is doped at a high density (for example, P ions are doped at a dose of about $1\times10^{15}$/cm$^2$ to $3\times10^{15}$/cm$^2$). When the TFT 215 is a p-channel type, a dopant of a third group element such as B, is doped, to form the low-density source area 210b and the low-density drain area 210c, and the high-density source area 210d and the high-density drain area 210e in the semiconductor layer 210a. The TFT may have an offset structure, without performing low-density doping, or the TFT may be a self-aligned type TFT by the ion implantation technology using the P ions and B ions, by designating the scan line 202a (gate electrode) as a mask. By this doping of impurities, the capacitor line 202b and the scan line 202a are rendered to have a lower resistance.

In parallel with these processes, peripheral circuits (see FIG. 9) such as the data line drive circuit 301 and the scan line drive circuit 304 having a complimentary structure, formed of an n-channel type TFT and a p-channel type TFT, are formed in the periphery on the active matrix substrate 230. In this embodiment, since the pixel switching TFT 215 is a polysilicon TFT, the peripheral circuits such as the data line drive circuit 301 and the scan line drive circuit 304 can be formed by substantially the same process at the time of forming the pixel switching TFT 215, which is advantageous in manufacturing.

Figure 12D:
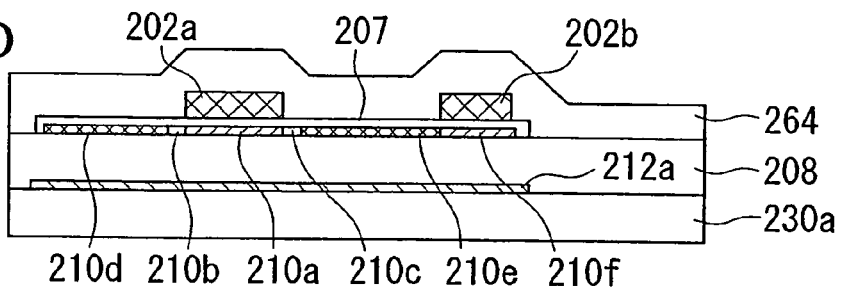

As shown in FIG. 12D, a first interlaminar insulating film 264 comprising a silicate glass film such as NSG (non-silicate glass), PSG (phosphorus silicate glass), BSG (boron silicate glass), or BPSG (boron phosphorus silicate glass), a silicon nitride film or a silicon oxide film is formed so as to cover the scan line 202a (gate electrode), the capacitor line 202b and the scan line 202a in the TFT 215, using for example the normal pressure or low pressure CVD method or a TEOS gas or the like (film forming process). The film thickness of the first interlaminar insulating film 264 is preferably from about 5000 angstroms to 15000 angstroms.

Figure 12E:
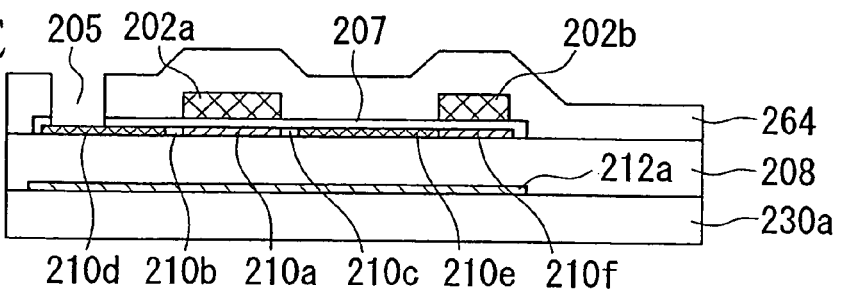

After performing the annealing processing at about 1000° C. for about 20 minutes in the hot wall device (heat treatment process) to activate the high-density source area 210d and the high-density drain area 210e, as shown in FIG. 12E, the contact hole 205 corresponding to the data line 201a (source electrode) is formed by dry etching such as reactive etching or reactive ion beam etching, or wet etching.

Figure 13A:
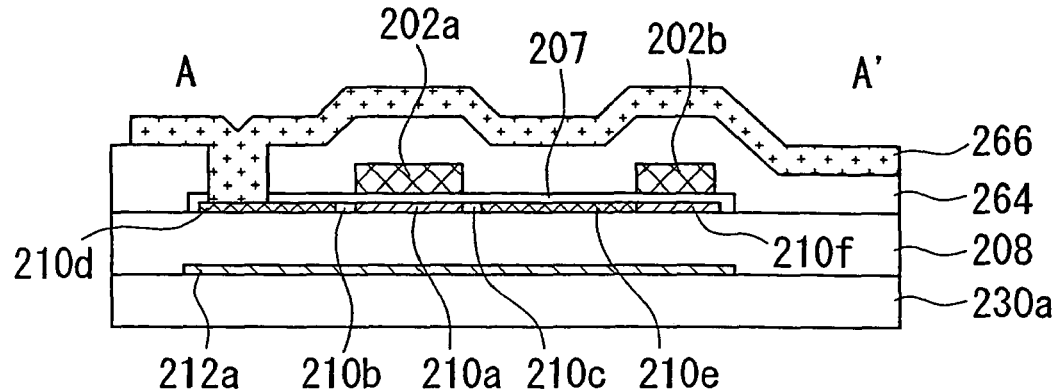
FIGS. 13A to 13C are process sectional views of respective processes conducted following the process shown in FIG. 12E, in the manufacturing method for the active matrix substrate of the liquid crystal panel.

Next, as shown in FIG. 13A, a metal film 266 such as a low-resistant metal such as Al or a metal silicide is deposited on the first interlaminar insulating layer 264 by sputtering processing or the like, to a thickness of from about 1000 angstroms to about 5000 angstroms, and preferably, to about 3000 angstroms (film forming process).

Figure 13B:
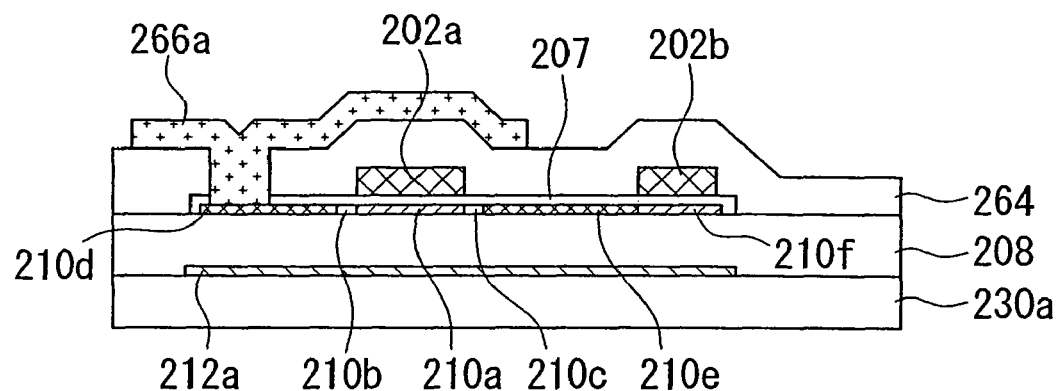

Then, as shown in FIG. 13B, the data line 266a (source electrode) is formed by the photolithographic process, etching process and the like.

Figure 13C:
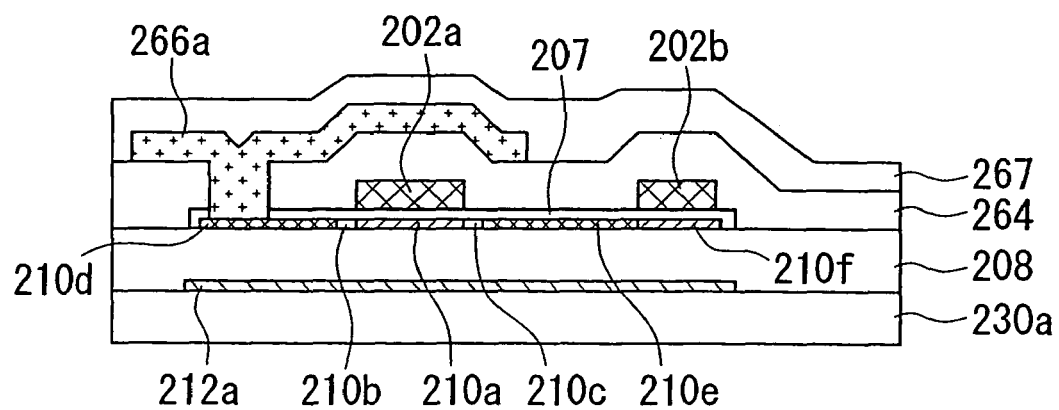

Next, as shown in FIG. 13C, a second interlaminar insulating film 267 comprising a silicate glass film such as NSG, PSG, BSG, or BPSG, a silicon nitride film or a silicon oxide film is formed so as to cover the data line 266a (source electrode), using for example the normal pressure or low pressure CVD method or a TEOS gas or the like (film forming process). Alternatively, instead of or overlapped on such a silicate film, an organic film or SOG may be spin coated, or subjected to the CMP processing, to form a flat film. The film thickness of the second interlaminar insulating film 267 is preferably from about 5000 angstroms to 15000 angstroms.

Figure 14A:
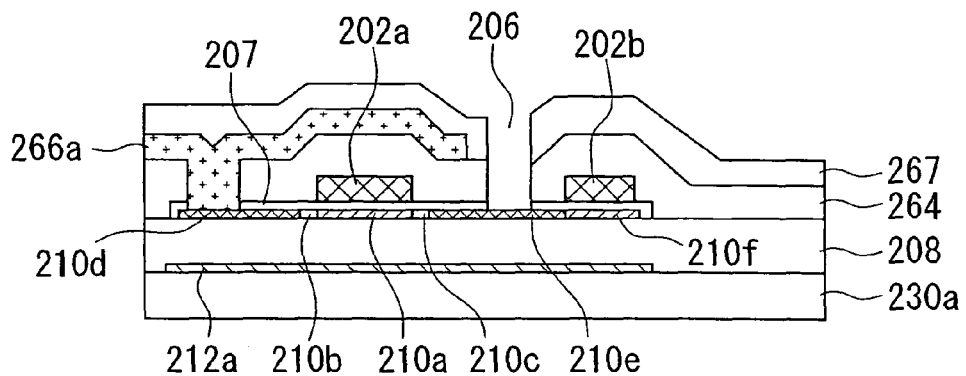
FIGS. 14A to 14C are process sectional views of respective processes conducted following the process shown in FIG. 13C, in the manufacturing method for the active matrix substrate of the liquid crystal panel.

Then, as shown in FIG. 14A, the contact hole 206 for electrically connecting the pixel electrode 204a and the high-density drain area 210e in the TFT 215 is formed by dry etching, such as reactive etching, reactive ion beam etching or the like. At this time, there is an advantage in that the opening shape can be made the same as the mask shape, by forming the contact hole 206 by anisotropic etching such as reactive etching, reactive ion beam etching or the like. If opening is formed by combining dry etching and wet etching, the contact hole 206 can be formed in a tapered shape, and hence there is an advantage in that disconnection at the time of connecting the wiring can be prevented.

Figure 14B:
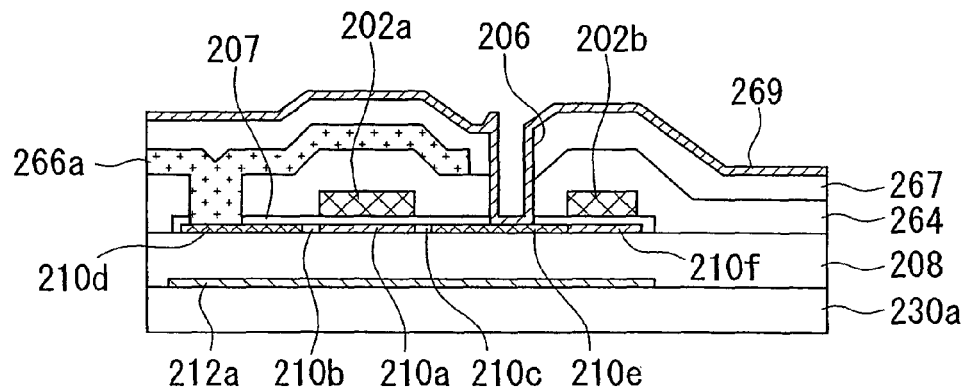

Next, as shown in FIG. 14B, a transparent conductive thin film 269 such as an ITO film is deposited on the second interlaminar insulating layer 267 by sputtering processing or the like, to a thickness of from about 500 angstroms to about 2000 angstroms (film forming process).

Figure 14C:
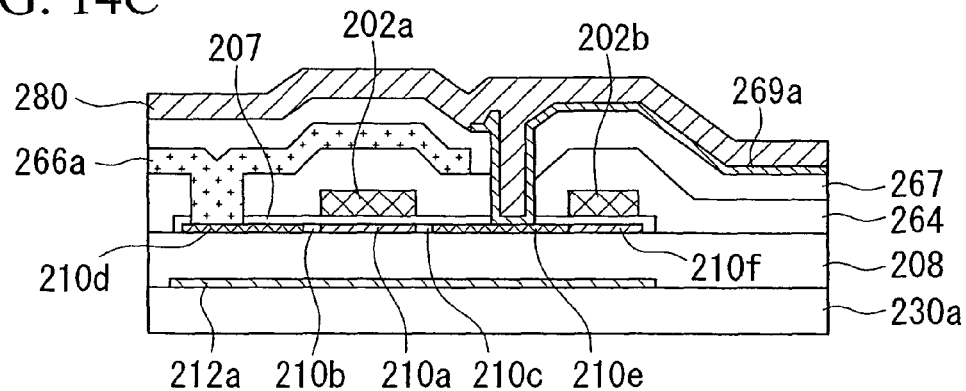

Then the transparent conductive thin film 269 is patterned by the photolithographic process, etching process or the like, to form the pixel electrode 269a as shown in FIG. 14C. When the liquid crystal panel 200 is used for a reflecting liquid crystal display, the pixel electrode 269a is formed of an opaque material having high reflectance such as aluminum.

Next, after an application liquid for a polyimide oriented film has been applied on the pixel electrode 269a, rubbing processing is conducted in a predetermined direction so as to have a predetermined pre-tilt angle, to form the oriented film 280.

Then, after a large-size substrate for the counter substrate is adhered to the large-size substrate 230a, these are cut into individual panels, or after the large-size substrate 230a is cut to give the active matrix substrate 230, the counter substrate is adhered thereto, and then liquid crystal is sealed therein.

Here, in this embodiment, the active matrix substrate 230 may be manufactured by array manufacturing in which processing is performed at the same size as when loading a mother glass substrate. Thereafter, the rubbing step, being a step in the assembly process, is executed, and thereafter, the panel is cut. As a result, the influence of warp of the substrate at the time of adhesion can be reduced, and the processing time for the alignment processing required for one substrate can be shortened, thereby improving the throughput.

For example, after having cleaned the active matrix substrate 230, polyimide (PI), which becomes the oriented film, is applied. Rubbing processing is then conducted with respect to the oriented film (corresponding to the oriented film 280) on the surface of the active matrix substrate.

In this case, the active matrix substrate 230 is then subjected to the cutting process. In the cutting process, the active matrix substrate 230 is cut into an optional size by various methods including, for example, scribe processing using a diamond cutter, dicing using a laser cutter and pure water, or water jet processing.

In the scribe processing, a scribe groove having a predetermined depth is formed, and the scribe groove portion is broken, to cut the TFT substrate. When the laser cutter is used, it is necessary to provide a gap for cutting between elements formed on the active matrix substrate 230. When using the laser cutter, since the corners on the cutting plane are rounded off by heat, there is an advantage in that a decrease in the yield due to the occurrence of damage to the substrate and the generated glass pieces can be prevented.

Figure 15:
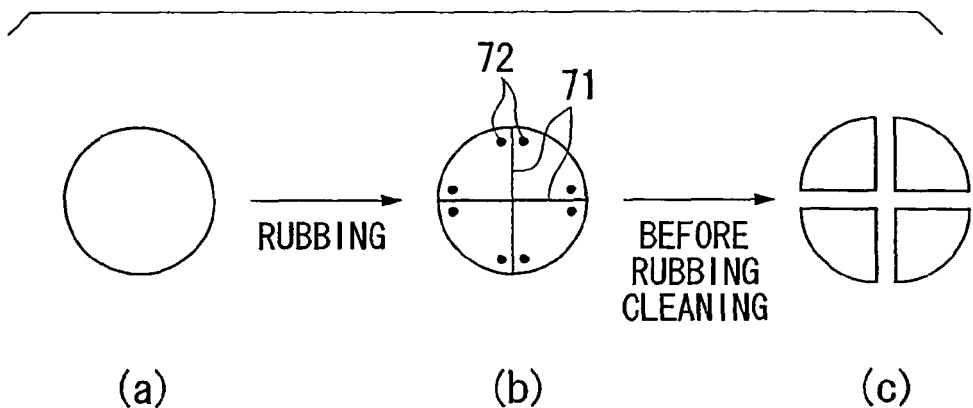
FIG. 15 is an explanatory diagram illustrating the condition of the glass substrate in the manufacturing process.

FIG. 15 illustrates the cutting method for the active matrix substrate in the cutting process. In FIG. 15, an example of cutting the substrate into four is shown.

(a) in FIG. 15 illustrates the substrate in the rubbing process, (b) in FIG. 15 illustrates the substrate in the middle of the cutting process, and (c) in FIG. 15 illustrates the substrate after having been cut.

The example in FIG. 15 illustrates the scribe processing, wherein in the active matrix substrate, scribe grooves 71 are formed in a cross shape passing through the vicinity of the center of the substrate by the scribe processing ((b) in FIG. 15). Then, as shown in (c) in FIG. 15, the substrate is cut into four along the scribe grooves 71. Each of the cut substrates has substantially the same sector shape in the example shown in FIG. 15. The substrate may be divided not only into four, but also into two or an appropriate division number, and the shape after cutting may not be the same shape.

Cutting is conducted so that the substrate is not divided in units of chips, but one TFT substrate is divided into a predetermined number. Division is conducted corresponding to the layout of elements formed on the active matrix substrate. To reduce the influence of warp of the substrate, it is best to shorten the length in one of the directions.

In the example shown in FIG. 15, the respective substrates after cutting have two sides crossing at a right angle, and these can be used for alignment. On the active matrix substrate in FIG. 15, alignment marks 72 used for the alignment processing after cutting are formed beforehand. The positions of the alignment marks 72 in (b) in FIG. 15 are located at portions which are not originally used for forming the active matrix substrate. These portions are advantageous as forming positions for the alignment marks when cutting the substrate into four.

The cut substrate is transferred to the respective lines for parallel processing. In each line, the apparatus are constructed corresponding to the shape of the cut plate and the position of the formed elements.

Next each of the cut substrates is subjected to a cleaning process. The cleaning process is for removing dust and dirt generated by the rubbing processing of the active matrix substrate and by the cutting process.

When the cleaning process has finished, the sealing material and the conductive material (not shown) are formed. The sealing material is formed by, for example, dispenser application. The sealing material may also be formed by screen printing. After having formed the sealing material, the counter substrate 240 is adhered to the active matrix substrate 230 at the respective element positions, and pressed while being aligned, to cure the sealing material.

The liquid crystal empty cells formed by curing the sealing material have relatively small differences in the magnitude of warp at respective positions of the substrate, even if warp occurs, since the area of the active matrix substrate becomes relatively small in the cutting process. In other words, gap distribution in the empty cells is substantially the same in all cells.

Moreover, since the area of the active matrix substrate at the time of adhesion is relatively small, and the number of formed elements is relatively small, alignment processing with respect to one substrate can be finished within a relatively short time. As a result, the difference in time for curing the seal, between a processed cell and an unprocessed cell is small, and hence a difference in quality of cells is minimal.

The liquid crystal is then filled from a notch provided in a part of the sealing material, and the notch is covered to seal the liquid crystal. In the liquid crystal filling process, the quantity of the liquid crystal to be filled is controlled, while controlling the pressure, so that the cell gaps become uniform. Since the gap distribution in the empty cells after adhesion is uniform, adjustment of the cell gap at the time of filling the liquid crystal is relatively easy, and hence liquid crystal cells having uniform cell gaps can be obtained.

Lastly, the liquid crystal cells in which the liquid crystal has been filled and tested are divided for each cell, to obtain liquid crystal panels.

In this embodiment, after the rubbing step in the middle of the assembly process, the TFT substrate is cut into a predetermined number of divisions and processes thereafter are executed. Hence, nonuniform distribution of the gap distribution in the adhesion process can be reduced, making the cell gaps uniform, and thereby preventing the occurrence of nonuniform gaps. Moreover, since adhesion is conducted on the active matrix substrate which has been divided into a plurality of parts, the alignment processing with respect to the elements on one substrate can be executed in short time. As a result, the throughput can be improved, and changes with lapse of time can be suppressed, thereby suppressing differences in quality of the elements.

As described above, in this embodiment, since the droplet discharge method is used, the liquid crystal to be filled includes one used for cleaning (flushing) of the droplet discharge head 21. Therefore wasteful use of the liquid crystal can be avoided, and the consumption thereof can be reduced.

As a result, liquid crystal devices can be manufactured at low cost. Moreover, there is a minimal drop in the display quality accompanying nonuniform arrangement of the liquid crystal, and poor sealing hardly occurs.

Third Embodiment

In the second embodiment, the droplet discharge device of the present invention is employed for forming the passive matrix type and active matrix type liquid crystal devices, and applied to filling of the liquid crystal into the liquid crystal layer, constituting the liquid crystal device, but the present invention is not limited thereto. For example, the oriented film constituting the liquid crystal device (for example, corresponding to the oriented films 108 and 110) may be formed by using the droplet discharge method in the first embodiment.

In this embodiment, a manufacturing process in which the oriented film in the liquid crystal device is formed by using the droplet discharge apparatus of the present invention will be described. Explanation for the parts overlapping on the description relating to the oriented film explained in the second embodiment is omitted. The same members as those used in the above description are denoted by the same reference symbols.

In this embodiment, the same apparatus as the droplet discharge apparatus shown in the first embodiment is employed. The oriented film material includes the organic materials such as polyimide, as described above, and has, for example, a component composition such as 3% of polyimide resin and 97% of a solvent.

The operation of the droplet discharge head 21, discharge from the nozzle 30, and the operation of the substrate stage 22 are controlled by the control unit 25. If these operation patterns are programmed in advance, it is easy to change the application pattern, corresponding to the application area and the application condition of the oriented film material.

The pitch of the nozzle 30 in the droplet discharge head 21, and the scanning pitch in the horizontal scanning direction (rendering direction) will be described, with reference to FIG. 16.

Figure 16:
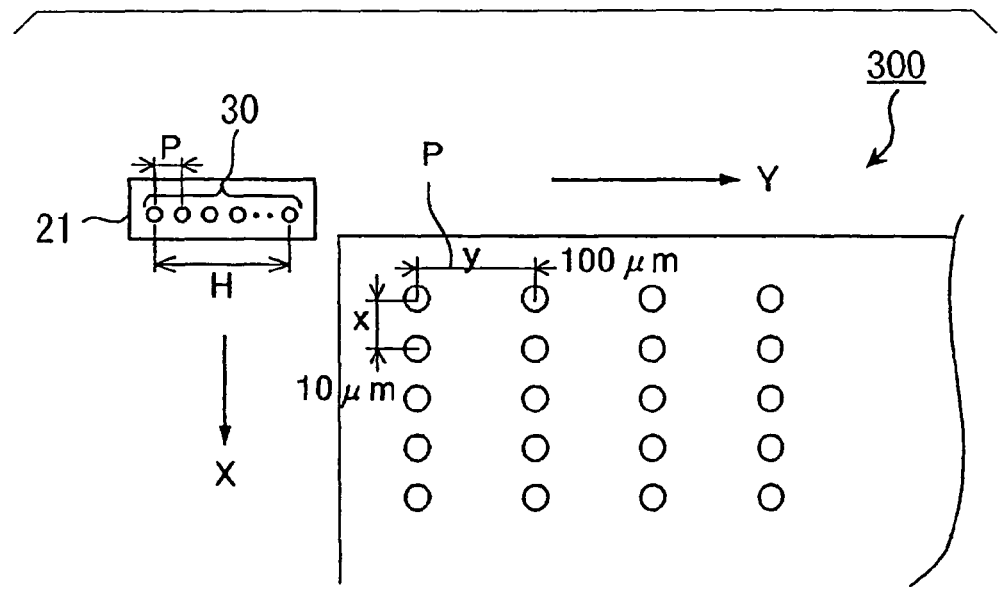
FIG. 16 is an explanatory diagram illustrating the operation of a droplet discharge head of the droplet discharge apparatus.

FIG. 16 is a plan view illustrating a state in which droplets of the oriented film material discharged from the droplet discharge head 21 are dropped. For example, it is assumed here that droplets of the oriented film material are dropped at a pitch of 10 μm in the horizontal scanning direction (X direction) and 100 μm in the vertical scanning direction (Y direction). In this case, the pitch y of droplets in the vertical scanning direction is the same as the pitch P of the nozzle 30, and the pitch x of droplets in the horizontal scanning direction depends on the scanning rate and the discharge frequency of the droplet discharge head 21.

FIG. 17 to FIG. 21 are plan views illustrating an exemplary arrangement of droplets according to the embodiment.

Figure 17:
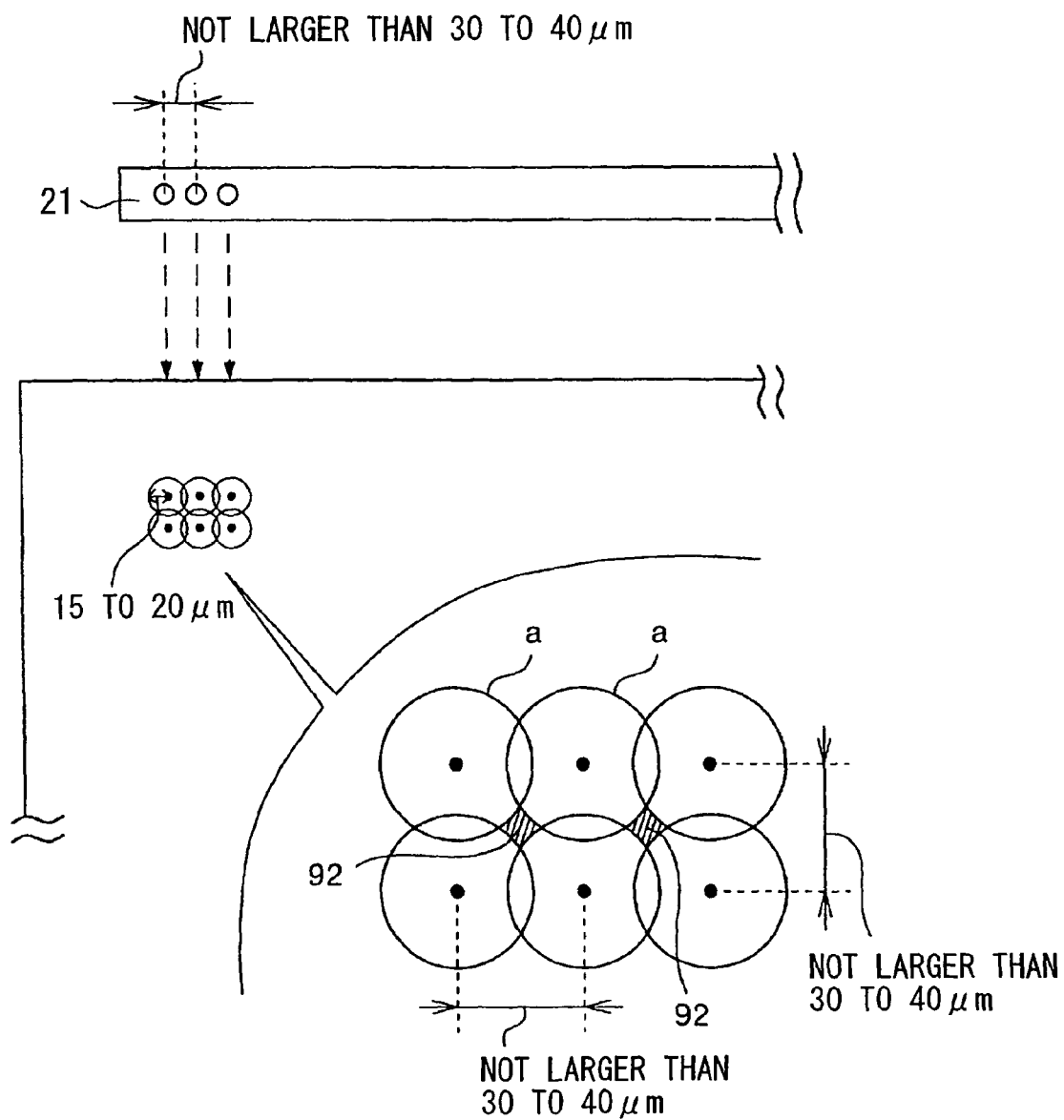
FIG. 17 is a plan view illustrating an exemplary arrangement of droplets dropped on the substrate.

As shown in FIG. 17, when rendering of the oriented film material is conducted by the droplet discharge method of the present invention, the discharge pitch (when there is a plurality of nozzles in the head, the nozzle pitch thereof) in the vertical scanning direction (in a direction orthogonal to the horizontal scanning direction), and the discharge pitch in the horizontal scanning direction are made not larger than the diameter of droplets (in this example, 30 to 40 μm, reference symbol a) immediately before impact before the droplets spread over the substrate (which is just after the impact; hereunder simply referred to as "immediately before impact"), so that the droplets of the oriented film material are not arranged on the substrate exceeding the pitch.

In other words, the respective pitches in the vertical scanning direction and the horizontal scanning direction are not adjusted to the impact diameter, but are adjusted not to exceed the diameter of droplets immediately before impact, so as to arrange the droplets of the oriented film material on the substrate. As described above, in FIG. 17, since the droplets before the droplets impact and spread on the substrate are connected to each other, the occurrence of lines and nonuniformity can be suppressed.

Figure 18:
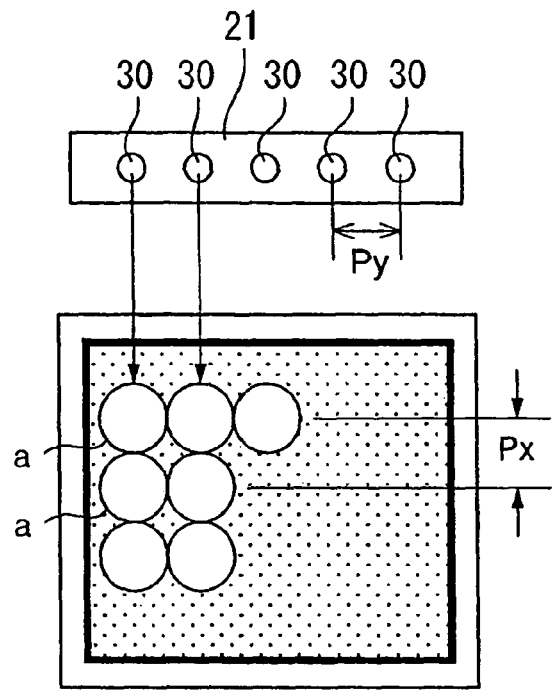
FIG. 18 is a plan view illustrating another exemplary arrangement of droplets dropped on the substrate.

The respective pitches need not necessarily be smaller than the diameter of the droplets immediately before impact. In FIG. 17, the adjacent droplets are overlapping on each other, but it is not necessary to overlap on each other. As shown in FIG. 18, the adjacent droplets need only to contact with each other, to connect the droplets to each other and form a single thin film.

As shown in FIG. 18, when a plurality of nozzles 30 is formed on the droplet discharge head 21, the pitch Py between nozzles 30 is designated as the above described "pitch not larger than the diameter of the droplets immediately before impact before spreading". Moreover, in the rendering direction (horizontal scanning direction), the pitch Px for discharging the droplets is also made "not larger than the diameter of droplets immediately before impact before spreading".

When rendering is conducted by the method shown in FIG. 17 and FIG. 18, droplets before spreading overlap on the adjacent droplets before spreading, and hence drop marks do not appear. As described above, arrangement of droplets at the time of rendering is performed such that the pitches between the adjacent droplets (both in the horizontal and vertical scanning directions) become "not larger than the diameter of the droplets before spreading".

Figure 19:
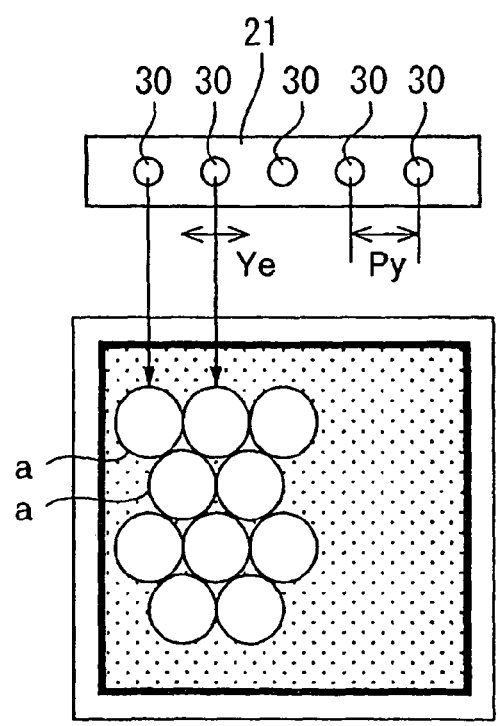
FIG. 19 is a plan view illustrating another exemplary arrangement of droplets dropped on the substrate.

The exemplary arrangement shown in FIG. 19 is different from those shown in FIG. 17 and FIG. 18, in that droplets immediately before impact and spreading in even lines in the horizontal scanning direction are dropped at positions shifted in the vertical scanning direction by about half the diameter of the droplet immediately before impact and spreading, as compared with the droplets immediately before impact and spreading in the odd lines.

Figure 20:
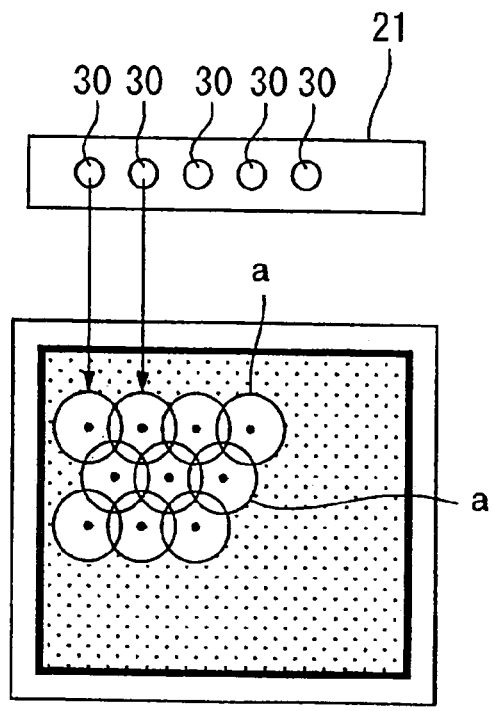
FIG. 20 is a plan view illustrating another exemplary arrangement of droplets dropped on the substrate.

FIG. 20 illustrates an arrangement in which the central positions of droplets in FIG. 19 are brought closer to each other. In FIG. 17, the area surrounded by four arcs and denoted by reference numeral 92 is not the droplet, but a portion where the droplets spread. Therefore, theoretically it becomes nonuniform, though slightly. On the other hand, in FIG. 20, optional droplets overlaps on other droplets over the whole periphery. As a result, nonuniformity does not occur.

Two methods can be mentioned as methods for realizing the above exemplary arrangements.

The first method is such that when rendering the droplets in even lines, then as shown by arrow Ye in FIG. 19, the droplet discharge head 21 is shifted relatively to the substrate in the vertical scanning direction by half the diameter of the droplet, as compared with rendering of droplets in odd lines.

Figure 21:
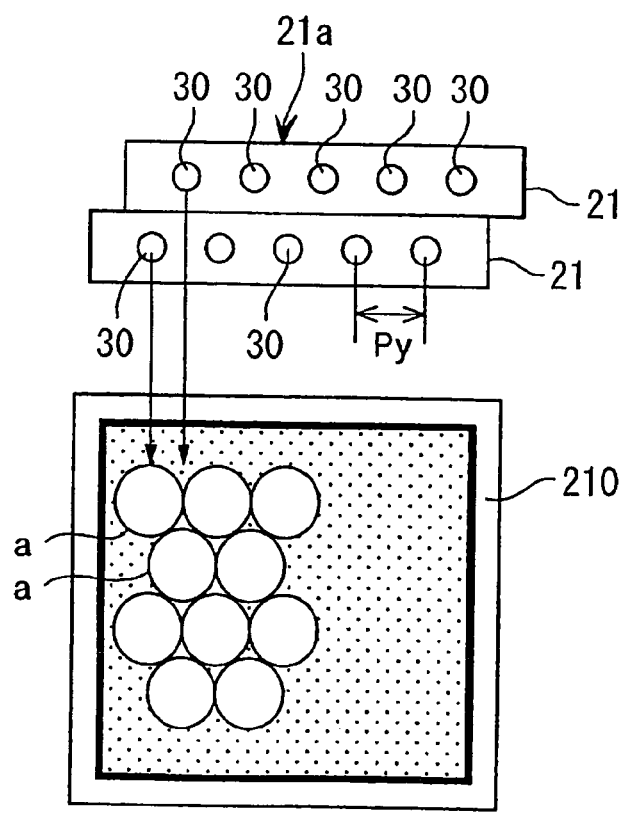
FIG. 21 is a plan view illustrating another exemplary arrangement of droplets dropped on the substrate.

The second method is such that as shown in FIG. 21, a head group 21a formed by fixing a pair of (a plurality of) droplet discharge heads 21 at a position shifted to each other in the vertical scanning direction by half the diameter of the droplet, is scanned (in the horizontal scanning direction) with respect to the substrate. At the time of rendering of droplets in the odd lines, droplets are discharged from the nozzles 30 in the first head 21 of the head group 21a, and at the time of rendering of droplets in the even lines, droplets are discharged from the nozzles 30 in the second head 21 of the head group 21a.

As described above, in this embodiment, the droplets are discharged so that the droplets immediately after impact on the substrate and before spreading are dropped at positions where adjacent droplets in the same state are brought into contact with each other.

Next, the application method for applying the oriented film material using the droplet discharge method of the present invention will be described below.

Figure 22:
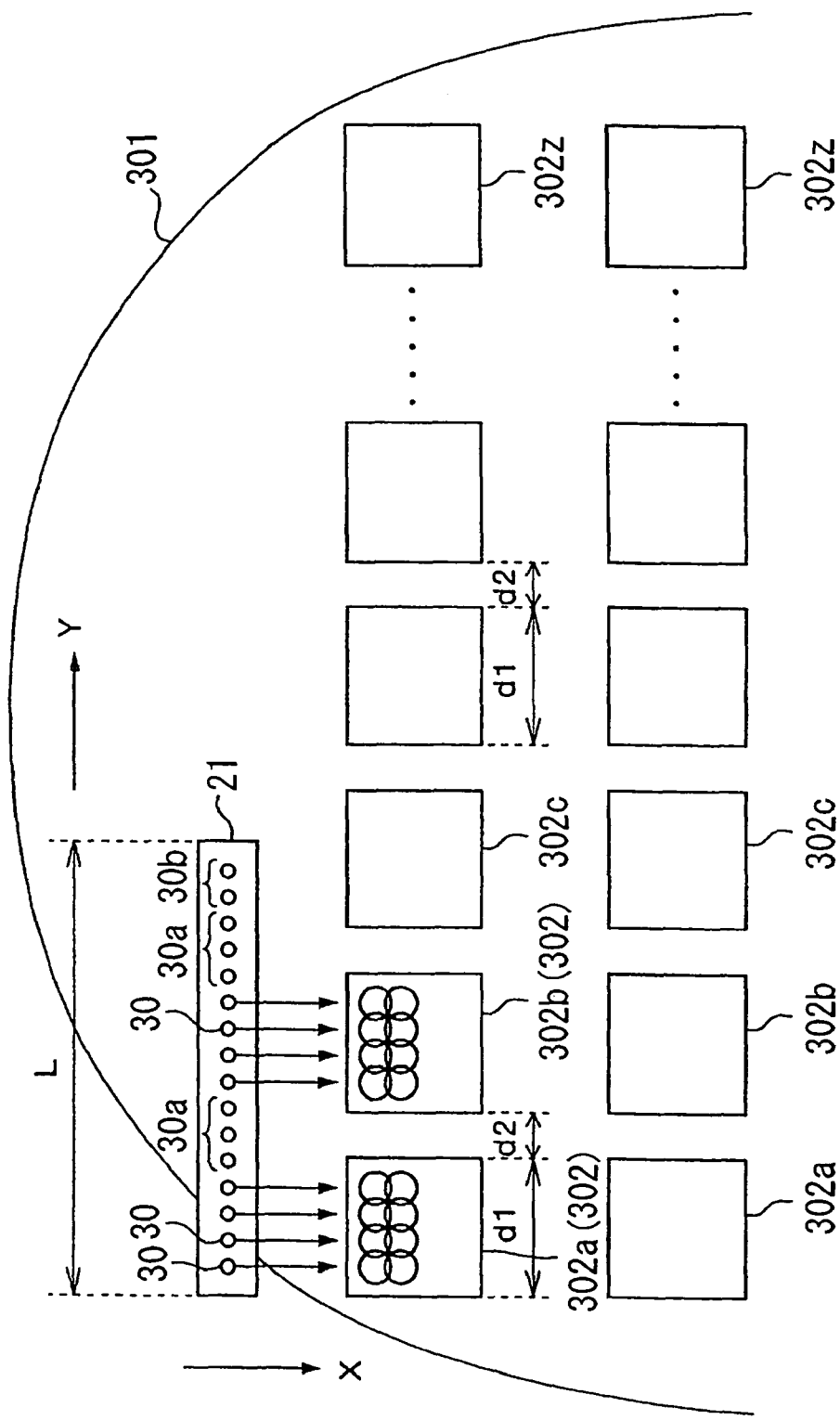
FIG. 22 is a plan view illustrating a discharge example of droplets dropped on the substrate.

FIG. 22 illustrates a case where a plurality of chips 302 is formed on a wafer 301. Each of the chips 302 is constructed as, for example, a liquid crystal panel for a mobile phone. The droplets of the oriented film material are discharged simultaneously with respect to the plurality of chips 302, using a plurality of nozzles 30 formed in the droplet discharge head 21.

In this case, to improve the mass-productiveness, it is desired to apply the droplets of the oriented film material with respect to the chips 302 as wide as possible on the wafer 301 in one horizontal scanning (in the X direction), by using all nozzles of the droplet discharge head 21 from one end to the other end in the lengthwise direction of the droplet discharge head 21.

In FIG. 22, the chips 302 are arranged in lines from 302a, 302b, 302c to 302z from the left end of the wafer 301. In this case, it is assumed that as shown in the figure, when the nozzle 30 at the one end of the droplet discharge head 21 is adjusted to the droplet arranging position for the chip 302a, the nozzle 31 at the other end of the droplet discharge head 21 is located in the middle position of the chip 301c.

To improve mass-productiveness, it is desired to be able to use all nozzles 30 in the arrangement state of the droplet discharge head 21 shown in FIG. 22. In other words, in the first horizontal scanning, the droplets are applied with respect to all areas of chips 302a and 302b, and the area up to the middle of the chip 302c, and in the second scanning, the droplets are applied with respect to the remaining half area of the chip 302c and chips 302d and after. In this manner, by using all nozzles 21 from the one end to the other end in the longitudinal direction of the droplet discharge head 21, the number of horizontal scannings required for application with respect to all chips 302, of the plurality of chips 302 on the wafer 301, can be reduced. This method is suitable for mass production, and normally this method is generally employed.

Figure 23:
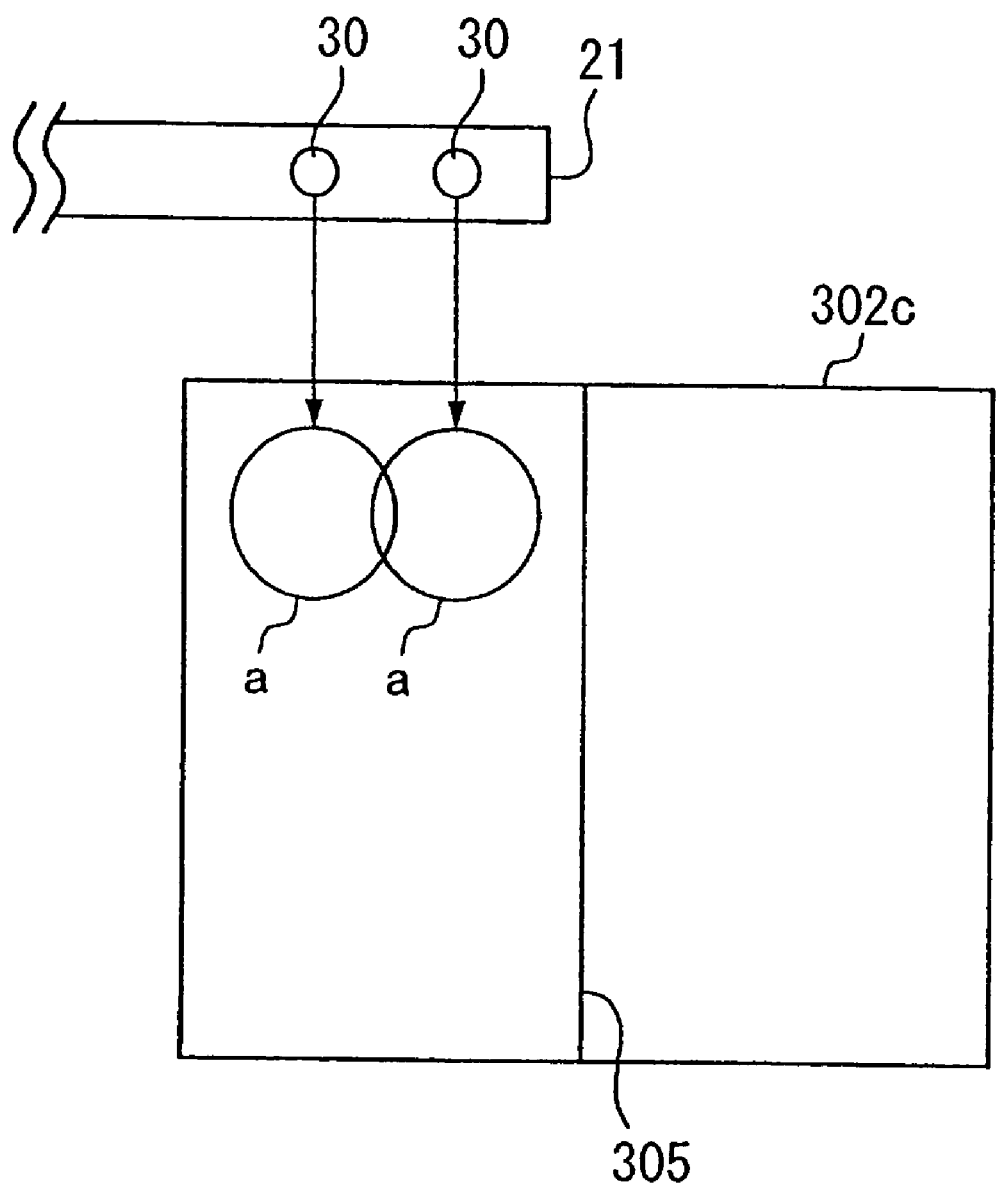
FIG. 23 is a plan view illustrating another discharge example of droplets dropped on the substrate.

In the above method, however, as shown in FIG. 23, droplets of the oriented film material are applied by two (a plurality of) horizontal scannings with respect to the one chip 302c. Therefore, in the area of the chip 302c where the oriented film material is to be applied (in the application area), an interface 305 between the air and the material is generated at the end portion of the application area of the oriented film material applied by the first horizontal scanning. Thereafter, the second horizontal scanning is conducted, and the droplets of the oriented film material are also applied on the interface 305, but the portion of the interface 305 has nonuniform dropping (application).

The application area herein stands for an area where the material (liquid) for the oriented film is to be applied, being an area of the maximum unit area where the occurrence of non-uniform application should be avoided (in this embodiment, each of the chips 302a to 302z). In other words, the application area is the maximum unit area where the whole surface should be applied uniformly (a chip in this embodiment, but including the substrate when one substrate is constituted by one wafer). The application area is generally a display area in a single panel.

Figure 24:
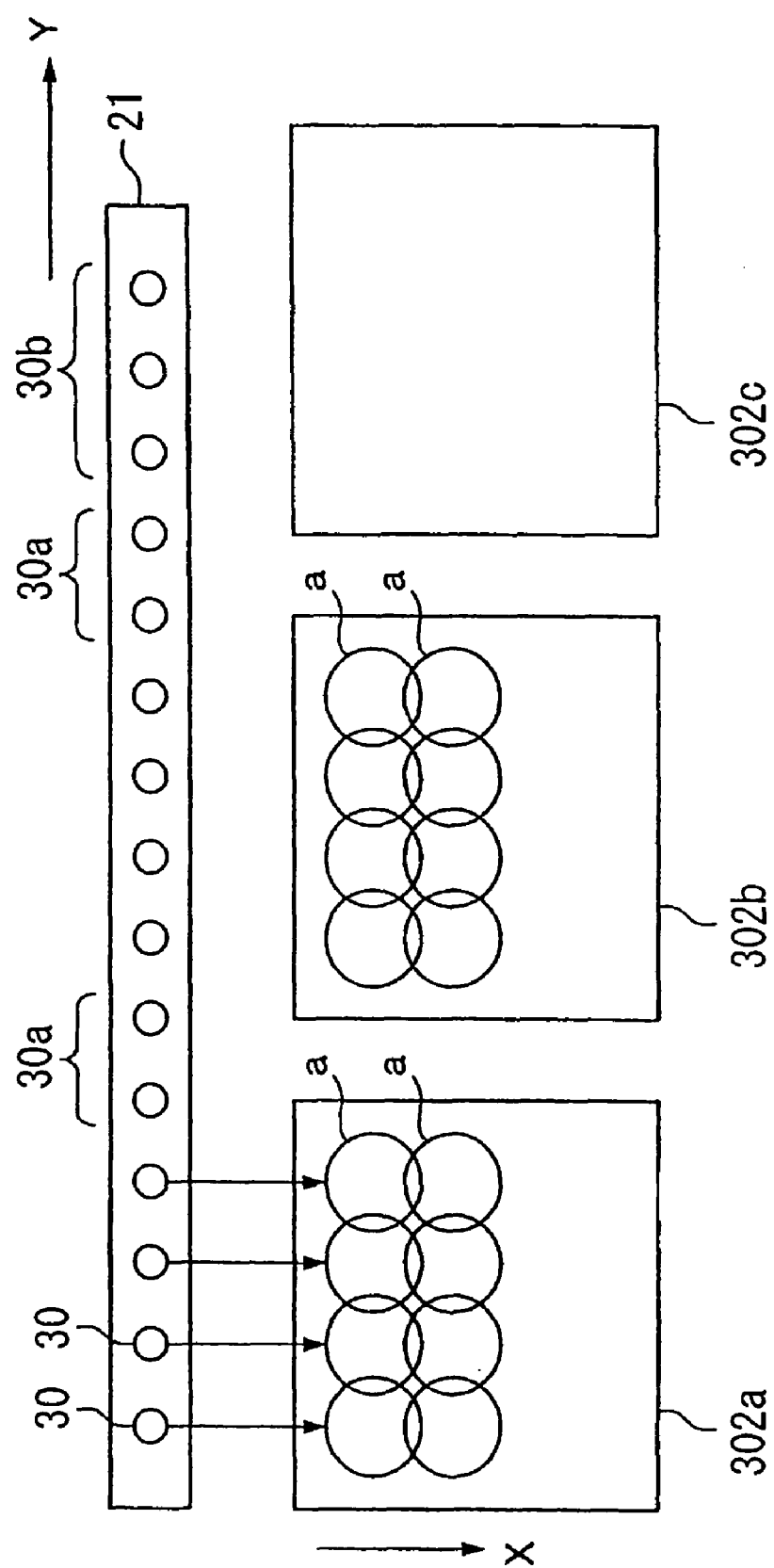
FIG. 24 is a plan view illustrating a first operation in the discharge example of droplets.

As shown in FIG. 23 and FIG. 24, when there is an application area where the droplets cannot be applied to the whole area thereof by one horizontal scanning (the chip 302c in this case) of the plurality of application areas (each of the chips 302a to 302z in this embodiment), droplets of the oriented film material are not applied in the horizontal scanning at this time, with respect to this application area (the chip 302e in this case).

In other words, as shown in FIG. 24, when the horizontal scanning of the droplet discharge head 21 is conducted, with the droplet discharge head 21 covering only up to the middle of the chip 302c, the whole area of the chip 302c cannot be applied in the horizontal scanning at this time. In such a situation, when the horizontal scanning is conducted, it is controlled such that droplets of the oriented film material are not discharged from the nozzles denoted by reference symbol 30b located above the chip 302c. Since the droplets of the oriented film material are not discharged from these nozzles 30b, an interface between the oriented film material and the air does not occur on the chip 302c, thereby preventing non-uniform application.

As described above, in the first scanning, droplets of the oriented film material are applied on the chips 302a and 302b. The nozzles denoted by reference symbols 30a are the nozzles from which the droplets of the oriented film material are not discharged in the horizontal scanning at this position. This is because the positions of the nozzles denoted by reference symbols 30a are not in the area where the droplets of the oriented film material are to be discharged (where no chip exists).

Figure 25:
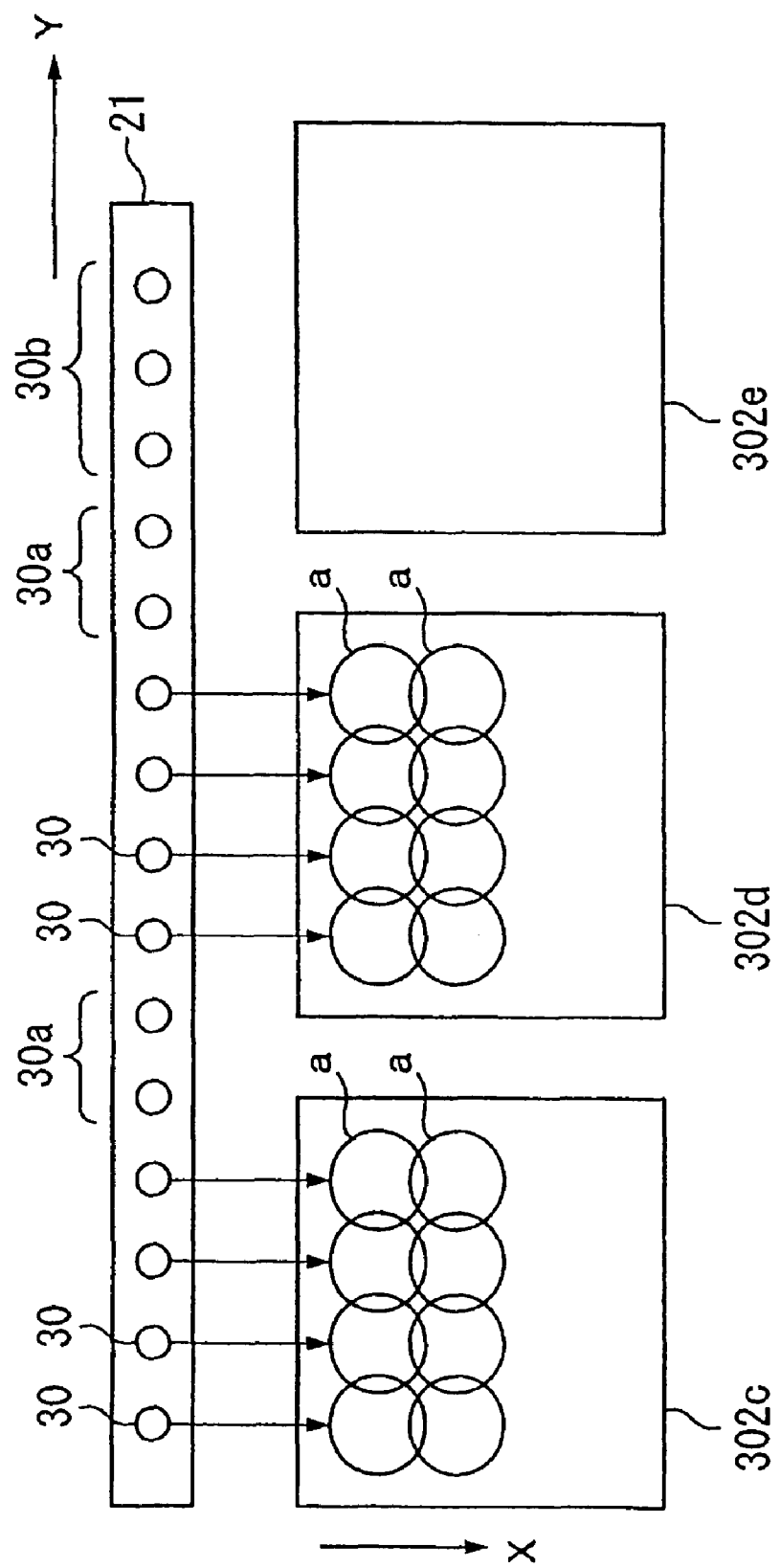
FIG. 25 is a plan view illustrating another operation in the discharge example of droplets.

From the position shown in FIG. 24, the droplet discharge head 21 conducts vertical scanning in a direction indicated by arrow Y, and as a result, as shown in FIG. 25, when the droplet discharge head 21 has reached the position where the whole area of the chip 302c, to which the droplets have not been applied in the previous (first) horizontal scanning, can be applied with the second horizontal scanning, the droplets of the oriented film material are applied to the chip 302c in the second horizontal scanning.

In the second horizontal scanning, as in the first horizontal scanning, when there is an application area where the droplets cannot be applied to the whole area thereof by one horizontal scanning (the chip 302e in this case) of the plurality of application areas (each of the chips 302a to 302z in this embodiment), droplets of the oriented film material are not applied in the horizontal scanning at this time with respect to this application area (the chip 302e in this case). Thereafter, the third horizontal scanning and onward is conducted likewise.

In the above example, at the time of each horizontal scanning, droplets of the oriented film material are discharged for chips 302 in two lines (for chips 302a and 302b for the first time, and chips 302c and 302d for the second time), but are not discharged from the nozzles 30 corresponding to the positions of the chips 302 in the third line (the chip 302c for the first time, and the chip 302e for the second time). When the application object of the droplets of the oriented film material is different from the wafer 301 in FIG. 22, that is, when the size and arrangement of the chips on the wafer are different from those shown in FIG. 22, then at the time of each horizontal scanning, discharge of the droplets of the oriented film material from which row of chips, and from which nozzles 30 the oriented film material is not discharged, are changed. For example, the number of chip lines for which the droplets of the oriented film material are to be discharged at the time of each horizontal scanning can be determined from the following equation, and the maximum value of n satisfying this equation obtained.

$$n \times d1 + (n-1) \times d2 \leq L$$

As shown in FIG. 22, d1 denotes the width of the chip 302 (the length of the side of the chip 302 along the lengthwise direction of the droplet discharge head 21, and more precisely, the width of the area where a liquid crystal film is to be formed in the chip 302), and d2 denotes a pitch between the chips 302 (more precisely, a pitch between the areas where the liquid crystal film is to be formed in the adjacent chips 302). L denotes the length of the droplet discharge head 21 in the lengthwise direction (more precisely, the length between the nozzle 30 at one end and the nozzle 30 at the other end of the droplet discharge head 21 in the lengthwise direction).

In the first horizontal scanning, the droplets of the oriented film material are applied up to the chips in the $n^{th}$ line, but are not discharged from the nozzles 30 corresponding to the position of the chip in the $(n+1)^{th}$ line.

In the second horizontal scanning, the droplets of the oriented film material are applied up to the chip (n+1−1+n) in the $n^{th}$ line, designating the $(n+1)^{th}$ line as a starting point of reckoning, but are not discharged from the nozzles 30 corresponding to the position of the chip in the $(n+1-1+n+1)^{th}$ line.

In the example shown in FIG. 22, since the following equations are established, $$2 \times d1 + (2-1) \times d2 \leq L$$

$$3 \times d1 + (3-1) \times d2 > L,$$

then the maximum value of n is 2.

In the first horizontal scanning, the droplets of the oriented film material are applied up to the chips in the second line (302a and 302b), but are not discharged from the nozzles 30 corresponding to the position of the chip (302c) in the $(2+1=3)^{rd}$ line.

In the second horizontal scanning, the droplets of the oriented film material are applied up to the chips (302c and 302d) in the second line (2+1−1+2=4), designating the $(2+1=3)^{rd}$ line as a starting point of reckoning, but are not discharged from the nozzles 30 corresponding to the position of the chip (302e) in the $(2+1-1+2+1=5)^{th}$ line.

As described above, the horizontal scanning for each time when the droplets of the oriented film material are applied to the chips 302 in a plurality of lines is conducted for the lines of the maximum value of n, satisfying $n \times d1 + (n-1) \times d2 \leq L$. As a result, any one chip 302 is not applied with the oriented film material by a plurality of horizontal scanning. The value of n is input to a program by an operator in advance, so that application of the droplets of the oriented film material by the droplet discharge head 21 can be conducted according to the input value of n.

In other words, when single horizontal scanning is conducted, in any single chip 302 (application area), an area where application of the oriented film material is conducted and an area where application of the oriented film material is not conducted do not exist together. In any single chip 302, all application areas in the single chip 302 are applied with the oriented film material by a single horizontal scanning. Since the application of the oriented film material is conducted with respect to the whole area of one application area by a single horizontal scanning, an interface between the oriented film material (liquid) and a gas phase is not generated on the single application area. As a result, a join in the scanning does not appear as a nonuniformity in the display area.

The droplet discharge head 21 in FIG. 22 is formed to have a pitch between nozzles 30, as shown in FIG. 17, such that a droplet of the oriented film material overlaps on the adjacent droplet before the droplets spread on each chip 302, and the discharge pitch in the horizontal scanning direction also has such a relation.

Instead of the above configuration, the droplet discharge head 21 in FIG. 22 may be formed to have a pitch between nozzles 30, as shown in FIG. 20, such that a droplet of the oriented film material overlaps on the adjacent droplet before the droplets spread on each chip 302, and the discharge pitch in the horizontal scanning direction also has such a relation. In this case, as shown in FIG. 20, an optional droplet (reference symbol a in FIG. 20) overlaps on other droplets (reference symbol a in FIG. 20) at the periphery thereof over the whole area in the peripheral direction.

Figure 26:
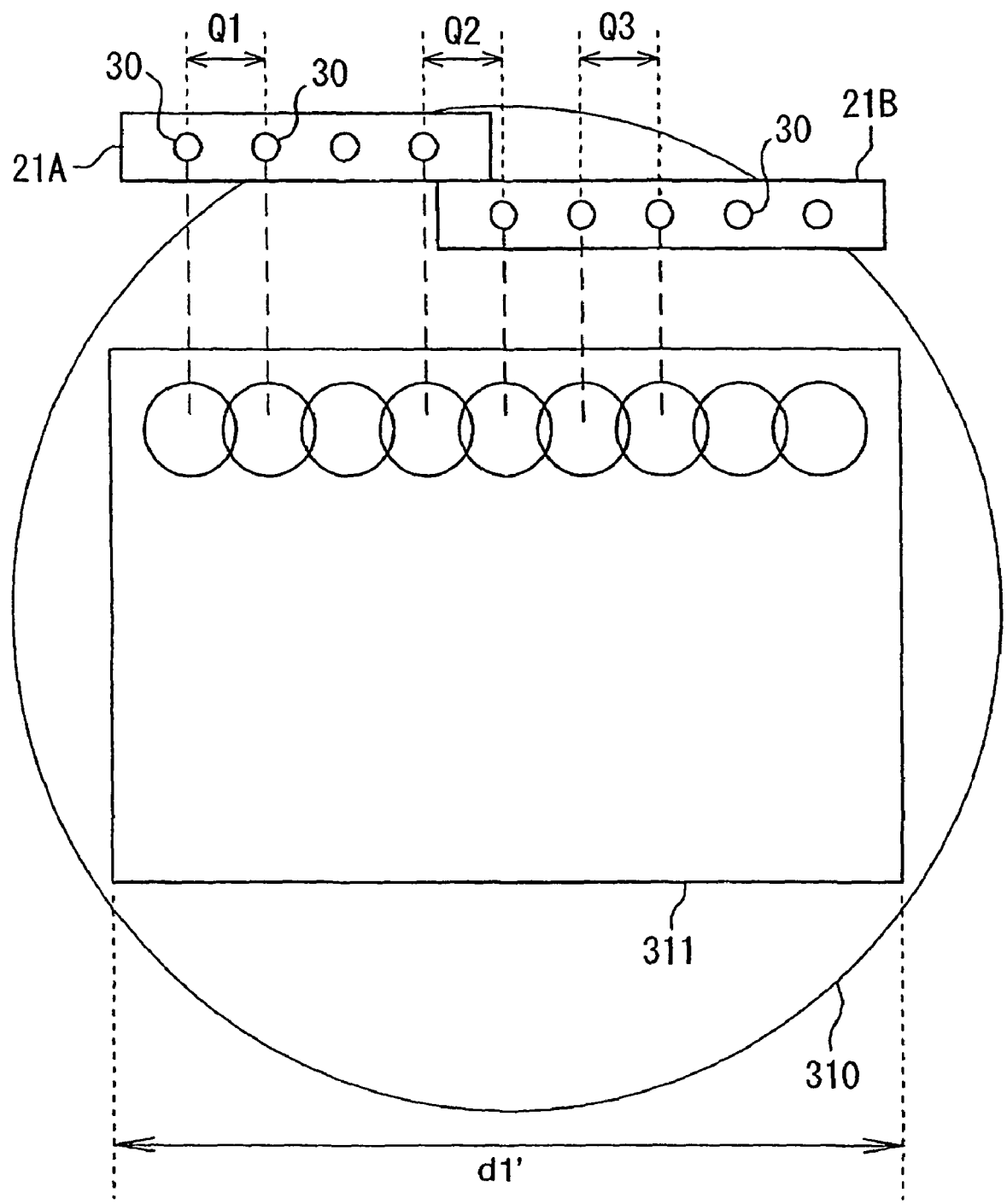
FIG. 26 is a plan view illustrating other discharge example of droplets dropped on the substrate.

FIG. 26 illustrates a modified example of this embodiment.

In FIG. 22, the length L of the droplet discharge head 21 is longer than the width d1 of a single application area, so that the whole area of at least one application area can be applied by one horizontal scanning. On the other hand, in FIG. 26, a single substrate 311 is formed on a single wafer 310. In the case of FIG. 26, the application area (substrate 311) is larger than the application area (chip 302) in the case of FIG. 22. To apply the droplets to the whole area in the application area by single horizontal scanning, it is necessary that the nozzles 30 are formed in the same range as the width d1' of the substrate 311.

When the length of one droplet discharge head 21 is smaller than the width d1' of the substrate 311, a plurality of droplet discharge heads 21A and 21B are connected so that the nozzles 30 are located in the same range as the width d1'. Moreover as shown in FIG. 22, even when the length of a single droplet discharge head 21 is larger than the chip width d1 in the application area (chip 302), a plurality of droplet discharge heads 21 may be connected to apply the droplets to a wider application area by single horizontal scanning.

In this case, the pitches Q1 and Q3 of the nozzle droplet discharge head 21 in the plurality of droplet discharge heads 21A and 21b to be connected are the same, and are set to match with a specified pitch (see FIG. 17 and FIG. 20).

A nozzle pitch Q2 at the junction of the plurality of droplet discharge heads 21A and 21B is set to have the same length as the specified nozzle pitch Q1. For example, it is desired to have a relation of Q1=Q2=Q3=30 to 40 μm.

According to the manufacturing method for the liquid crystal device in this embodiment, when the droplet discharge head conducts a plurality of scannings to drop the oriented film material onto the display area, an interface is generated between the oriented film material and the air by the number of scans in the display area, to cause nonuniform rendering in this portion. However, in this embodiment, dropping of the oriented film material is conducted with respect to the whole display area in the panel by one rendering (scanning), thereby removing the interface between the oriented film material and the air in the display area and preventing nonuniform dropping of the oriented film material.

Moreover in this embodiment, since the above described droplet discharge method is used, the oriented film material includes one used for cleaning (flushing) of the droplet discharge head 21. Therefore, wasteful use of the oriented film material is avoided, and the consumption thereof can be reduced.

As a result, liquid crystal devices can be manufactured at low cost.

Fourth Embodiment; Third Manufacturing Method for Liquid Crystal Devices

In the third embodiment, explanation was given for a case where an oriented film constituting the liquid crystal device was formed by using the droplet discharge method shown in the first embodiment. The protection film (for example, corresponding to the over coat film 106) constituting the liquid crystal device may similarly be formed by using the droplet discharge method.

In this embodiment, the manufacturing method for a color filter in the liquid crystal will be described in detail, and the manufacturing process for forming the protection film formed on the color filter by using the droplet discharge apparatus of the present invention will be described. Explanation for the parts overlapping on the description relating to the color filter explained in the second embodiment is omitted. The same members as those used in the above description are denoted by the same reference symbols.

FIG. 27A to FIG. 27D schematically illustrate the manufacturing method for the color filter 104 in process sequence. At first, partitions 105 are formed of a resin material, which does not have transmittance, on the surface of a glass substrate 101 in a lattice pattern, as seen from a direction of arrow B. Portions 120 at the lattice hole in the lattice pattern are areas where a filter element 104R, 104G, or 104B is formed, that is, filter element areas. The surface dimensions of the individual filter element area 120 formed by the partitions 105, as seen in the direction of arrow B, is formed to be for example 30 μm×100 μm.

The partitions 105 have both a function of preventing the flow of filter element material supplied to the filter element area 120 and a function of a black matrix. The partitions 105 are formed by an optional patterning method, for example, a photolithographic method, and according to need, heated by a heater and fired.

Figure 27A:
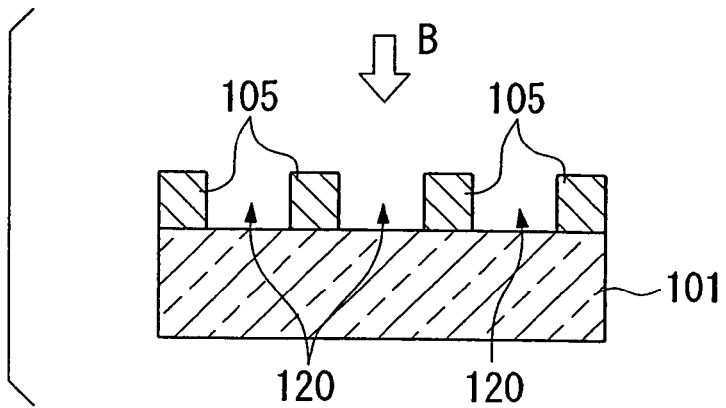
FIGS. 27A to 27D are sectional views illustrating a manufacturing process for a color filter.
Figure 27B:
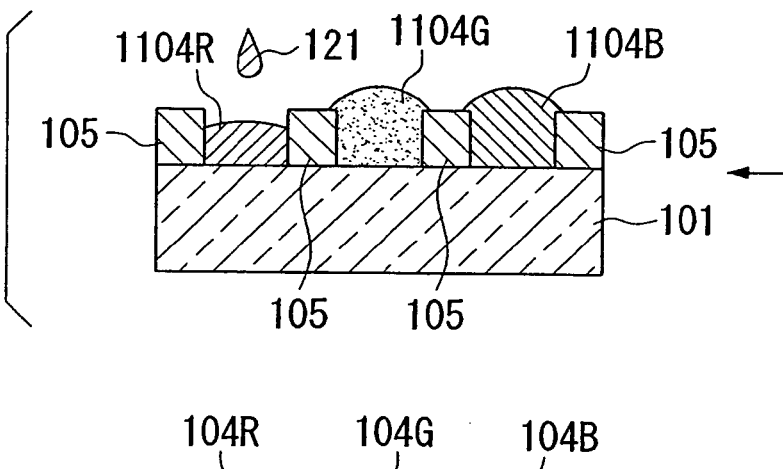

After having formed the partitions 105, as shown in FIG. 27B, droplets 121 of filter element material are supplied to the respective filter element areas 120, to fill the respective filter element areas 120 with the filter element material 1104. In FIG. 27B, reference symbol 1104R denotes a filter element material having red (R) color, reference symbol 1104G denotes a filter element material having green (G) color, and reference symbol 1104B denotes a filter element material having blue (B) color.

Figure 27C:
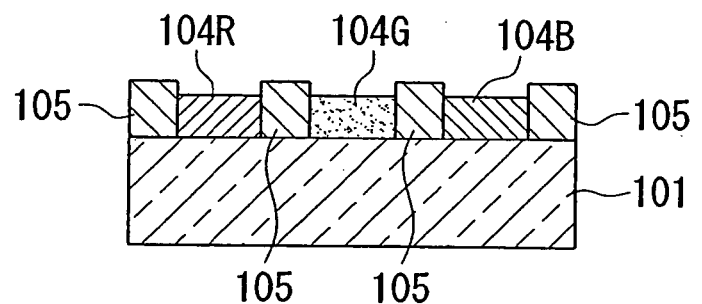
Figure 27D:
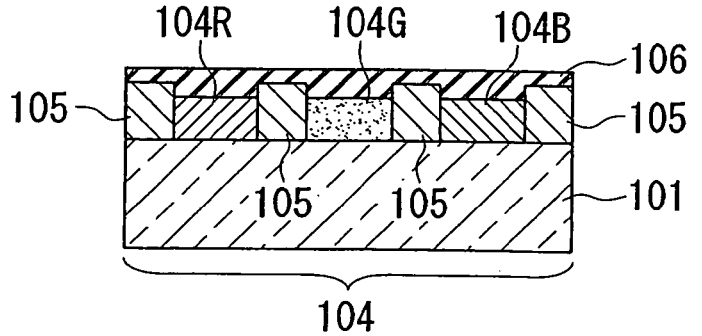

When a specified quantity of filter element material has been filled in the respective filter element areas 120, the substrate 101 is heated to about 70° C. by a heater, to evaporate the solvent of the filter element material. By this evaporation, as shown in FIG. 27C, the volume of the filter element material 1104 decreases and is flattened. If a decrease in the volume is excessive, supply and heating of droplets of the filter element material are repeated until a sufficient film thickness as the color filter can be obtained. By the above processing, only the solid of the filter element material remains finally and is formed as a film. As a result, desired respective color filter elements 104R, 104G and 104B are formed.

After the filter elements 104R, 104G and 104B are formed, heat treatment is executed at a predetermined temperature for predetermined time, to dry these filaments 104R, 104G and 104B completely. Thereafter, an over coat layer 106 is formed by using the droplet discharge method described in the first embodiment. The over coat layer 106 is formed for protecting the filter elements 104R, 104G and 104B, and flattening the surface of the color filter 104.

In this embodiment, since the droplet discharge method is used, the material for the over coat layer 106 includes one used for cleaning (flushing) of the droplet discharge head 21. Therefore, wasteful use of the material for the over coat layer is avoided, and the consumption thereof can be reduced.

As a result, liquid crystal devices can be manufactured at a low cost.

Fifth Embodiment

A specific example of electronic apparatus of the present invention will be described below.

Figure 28:
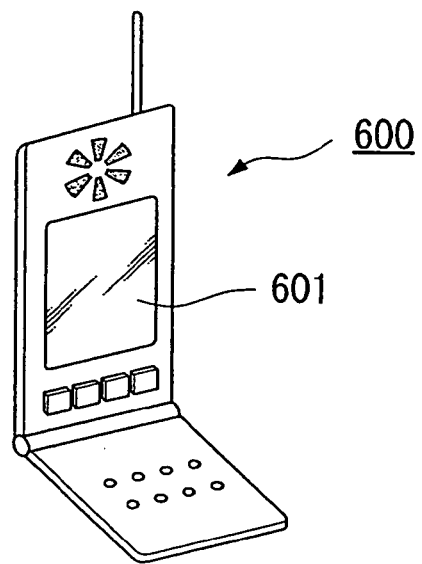
FIG. 28 is a diagram illustrating an example in which the electronic apparatus of the present invention is applied to a mobile phone having a liquid crystal display.

FIG. 28 is a perspective view illustrating one example of a mobile phone. In FIG. 28, reference numeral 600 denotes a mobile phone body, and 601 denotes a liquid crystal display section having the liquid crystal device shown in FIG. 4.

Figure 29:
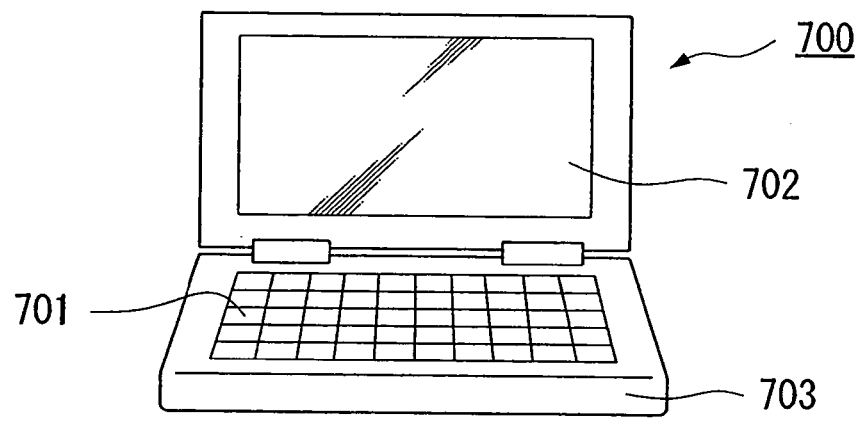
FIG. 29 is a diagram illustrating an example in which the electronic apparatus of the present invention is applied to a portable information processor having a liquid crystal display.

FIG. 29 is a perspective view illustrating one example of a portable information processor such as a word processor or a personal computer. In FIG. 29, reference numeral 700 denotes an information processor, 701 denotes an input section such as a keyboard, 703 denotes an information processing body, and 702 denotes a liquid crystal display section having the liquid crystal device shown in FIG. 4.

Figure 30:
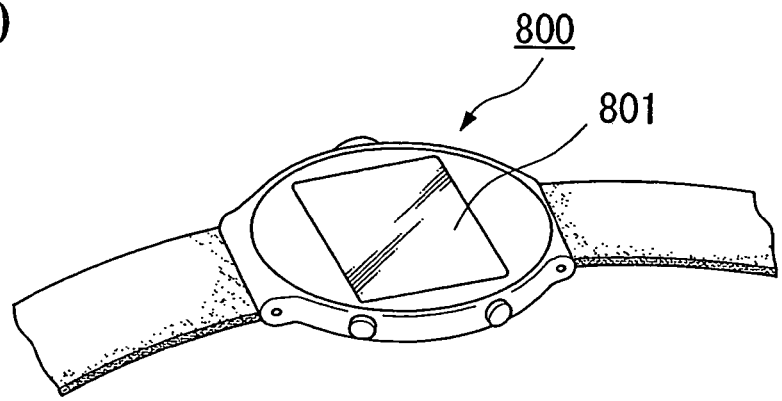
FIG. 30 is a diagram illustrating an example in which the electronic apparatus of the present invention is applied to watch type electronic apparatus having a liquid crystal display.

FIG. 30 is a perspective view illustrating one example of a watch type electronic device. In FIG. 30, reference numeral 800 denotes a watch body, and 801 denotes a liquid crystal display section having the liquid crystal device shown in FIG. 4.

The electronic apparatus shown in FIG. 28 to FIG. 30 comprises the liquid crystal device in the above embodiments, and hence a drop in display quality and poor sealing hardly occur, while achieving a low cost.

In the above embodiments, a passive matrix type liquid crystal device and an active matrix type liquid crystal device using a TFT as a switching element have been employed, but for example, an active matrix type liquid crystal device using a TFD (Thin Film Diode) as a switching element may be used.

Moreover, in the above embodiments, the liquid crystal and oriented film material used in the liquid crystal device, and the liquid material for the protective film (such as the material for the over coat film) are mentioned as the liquid material to be arranged quantitatively, but the present invention is not limited to these liquid materials.

Other adoptable liquid materials include a resist (photoresist), a color ink, an SOG (Spin On Glass), a Low-k material for forming a low-permittivity interlaminar insulating film, other liquid materials such as volatile liquid materials, liquids containing fine metal particles, materials for a light emitting layer of an organic EL, and materials for hole injection transport beds. For example, in the second embodiment, explanation has been given to a process for forming a resist mask on a metal film by using the photolithographic technique, to form the shading film 212*a*. However, instead of the resist application method, the droplet discharge method of the present invention may be adopted.

The electronic apparatus in the above embodiments comprises the liquid crystal device, but the electronic apparatus may comprise other electro-optic devices such as an organic electroluminescence display or a plasma display.

Preferred embodiments of the present invention has been described above with reference to the accompanying drawings, but needless to say, the present invention is not limited to these embodiments. The various shapes and combination of the respective components in the embodiments are examples only, and may be variously changed based on design requirement or the like within the range which does not depart from the gist of the present invention.

What is claimed is:

1. A droplet discharge apparatus that disposes a liquid material on a plurality of application areas of a substrate, the apparatus comprising:
   a droplet discharge head that has a plurality of nozzles that define a width of a nozzle line, the liquid material being discharged in droplets on the plurality of application areas in a plurality of scannings by the plurality of nozzles;
   a liquid material supply system that supplies the liquid material to the plurality of nozzles; and by
   a control unit that controls movement of the droplet discharge head so that the droplets are applied to each of the plurality of application areas in a single scanning by means of the control unit:
   determining, based on a single scanning, whether an application area of the plurality of application areas is completely covered by the width of the nozzle line or whether an application area of the plurality of application areas is not completely covered by the width of the nozzle line; and
   discharging, based on the determination of the single scanning, the droplets on each application area that is completely covered by the width of the nozzle line and not discharging droplets on each application area that is not completely covered by the width of the nozzle line.

2. The droplet discharge apparatus according to claim 1, further comprising:
   a temperature control device that warms the liquid material to room temperature or higher.

3. A liquid crystal device, comprising at least one component of a component group consisting of a liquid crystal layer, an oriented film, and a protection film for a color filter,
   wherein a droplet discharge apparatus according to claim 1 is used to form at least one component of the component group.

4. An electronic apparatus comprising the liquid crystal device according to claim 3.

5. The droplet discharge apparatus according to claim 1,
   wherein a measuring device measures a weight of the liquid material that has been disposed on the substrate, and
   the control unit controls the quantity of the liquid material being disposed on the substrate by controlling the weight of liquid material that has been disposed on the substrate.

6. The droplet discharge apparatus according to claim 1, further comprising a measuring device that measures a quantity of the liquid material disposed on the substrate, wherein
   when the quantity of the liquid material disposed on the substrate reaches a specified quantity, the discharge of the liquid material from the nozzle is stopped.

7. The droplet discharge apparatus according to claim 1, wherein the plurality of nozzles are arranged in one scanning direction such that a nozzle pitch between the plurality of nozzles is smaller than a diameter of the droplets immediately before impact on the substrate, and
   the control unit controls movement of the droplet discharge head so that a pitch of movement in an other scanning direction is smaller than the diameter of the droplets immediately before impact on the substrate.

* * * * *